(12) United States Patent
Kurashina et al.

(10) Patent No.: US 7,311,809 B2
(45) Date of Patent: Dec. 25, 2007

(54) PLATING APPARATUS FOR SUBSTRATE

(75) Inventors: Keiichi Kurashina, Tokyo (JP); Mizuki Nagai, Tokyo (JP); Satoru Yamamoto, Tokyo (JP); Hiroyuki Kanda, Tokyo (JP); Koji Mishima, Tokyo (JP); Brett Baker, Yorktown Heights, NY (US); Hariklia Deligianni, Yorktown Heights, NY (US); Phillipe Vereecken, Yorktown Heights, NY (US)

(73) Assignees: Ebara Corporation, Tokyo (JP); International Business Machines Corporation, Armonk, NY (US)

( * ) Notice: Subject to any disclaimer, the term of this patent is extended or adjusted under 35 U.S.C. 154(b) by 421 days.

(21) Appl. No.: 10/930,823

(22) Filed: Sep. 1, 2004

(65) Prior Publication Data

US 2005/0077173 A1    Apr. 14, 2005

(30) Foreign Application Priority Data

Sep. 2, 2003    (JP)    ............................. 2003-310355

(51) Int. Cl.
   *C25D 17/00*    (2006.01)
(52) U.S. Cl. .............................. 204/224 R; 204/230.2
(58) Field of Classification Search ................. 205/93, 205/640, 662; 204/224 M, 230.3, 224 R, 204/230.2; 451/36, 41
   See application file for complete search history.

(56) References Cited

U.S. PATENT DOCUMENTS 6,402,925 B2    6/2002    Talieh
6,534,116 B2    3/2003    Basol
6,632,335 B2 *  10/2003   Kunisawa et al. ........ 204/230.2
6,736,952 B2 *  5/2004    Emesh et al. .................. 205/81
6,913,681 B2 *  7/2005    Matsuda et al. ............ 205/117

* cited by examiner

Primary Examiner—Nam Nguyen
Assistant Examiner—Luan V. Van
(74) Attorney, Agent, or Firm—Wenderoth, Lind & Ponack, L.L.P.

(57) ABSTRACT

The present invention provides a plating apparatus for a substrate which can plate a substrate under uniform pressure without increasing a load to be applied while holding the entire surface of a porous member in contact with the surface, to be plated, of the substrate. The plating apparatus for a substrate, includes: a substrate holder for holding a substrate; a cathode unit having a seal member for abutting against and sealing, in a water-tight manner, a peripheral portion of a surface, to be plated, of the substrate held by the substrate holder, and a cathode electrode which is brought into contact with the substrate to supply current to the substrate. An anode which is vertically moveable is disposed in confronting relation to the surface, to be plated, of the substrate; a plating solution impregnated material is disposed between the anode and the surface, to be plated, of the substrate, the plating solution impregnated material being made of a water-retentive material; and a porous member is disposed between the plating solution impregnated material and the surface, to be plated, of the substrate. The plating solution impregnated material is constructed of a plurality of separate members.

17 Claims, 28 Drawing Sheets

PLATING APPARATUS FOR SUBSTRATE

BACKGROUND OF THE INVENTION

1. Field of the Invention

The present invention relates to a plating apparatus for a substrate, and more particularly to a plating apparatus for a substrate used for filling a fine interconnect pattern formed in a semiconductor substrate with metal (interconnect material), such as copper, so as to form interconnects.

2. Description of the Related Art

Recently, there has been employed a circuit forming method comprising forming fine recesses for interconnects, such as interconnect trenches or via holes in a circuit form, in a semiconductor substrate, embedding the fine recesses with copper (interconnect material) by copper plating, and removing a copper layer (plated film) at portions other than the fine recesses by means of CMP or the like.

A plating apparatus having the following configuration has been known as this type of plating apparatus used for plating to form fine interconnects having high aspect ratios. A substrate is held in such a state that a surface (surface to be plated) of the substrate faces upward (in a face-up manner). A cathode electrode is brought into contact with a peripheral portion of the substrate so that the surface of the substrate serves as a cathode. An anode is disposed above the substrate. While a space between the substrate and the anode is filled with a plating solution, a plating voltage is applied between the substrate (cathode) and the anode to plate a surface (surface to be plated) of a substrate (for example, see Japanese laid-open patent publication No. 2002-506489).

In a plating apparatus in which a substrate is held and plated in single wafer processing while a surface of the substrate faces upward, a distribution of a plating current can be made more uniform over an entire surface of the substrate to improve uniformity of a plated film over the surface of the substrate. Generally, the substrate is transferred and subjected to various processes in such a state that a surface of the substrate faces upward. Accordingly, it is not necessary to turn the substrate at the time of plating.

Meanwhile, in order to deposit a copper plated film selectively in interconnect trenches in a circuit form or the like, there has been known a method of bringing a porous member into contact with a substrate such as a semiconductor wafer, and plating the substrate while relatively moving the porous member in a contact direction. As a porous member in this method, there have generally been used PVA, porous Teflon (registered trademark), polypropylene knitted like a textile or skimmed like a paper, and unformed materials such as gelated silicon oxide or agar (for example, see Japanese laid-open patent publication No. 2000-232078).

However, in a method comprising bringing a porous member into contact with a substrate and plating the substrate while relatively moving the porous member in a contact direction, it is difficult to uniformly press the overall surface of the porous member against the surface, to be plated, of the substrate so as to bring it into close contact with the surface of the substrate because of the surface roughness of the surface of the porous member or a pressing member for pressing the porous member against the surface to be plated, or undulations or warpages produced in the porous member when the porous member is pressed against the surface, to be plated, of the substrate. For this reason, gaps are locally formed between a porous member and a surface, to be plated, of a substrate. Thus, plating non-uniformity is caused over the surface of the substrate.

It is considered that the entire surface of the porous member can be brought into contact with the surface, to be plated, of the substrate closely by increasing loads to bring the porous member into contact with the substrate to be plated. In such a case, an extremely large load is applied to the substrate. Accordingly, in a case where a soft interlevel dielectric layer such as a low-k material is processed, the interlevel dielectric layer is broken, and a surface of a plated film is likely to be scratched. Thus, it has been difficult to put the above method into practice. Even if the entire surface of the porous member can be brought into contact with the surface to be plated under a high load applied thereto, the pressure under which the porous member and the surface to be plated tends to vary from place to place, causing the porous member and the pressing member which presses the porous member against the surface to be plated to transfer their surface irregularities, undulations, and warpages directly to the plated film.

SUMMARY OF THE INVENTION

The present invention has been made in view of the above situation in the related art. It is therefore an object of the present invention to provide a plating apparatus for a substrate which can plate a substrate under uniform pressure without increasing a load to be applied while holding the entire surface of a porous member in contact with the surface, to be plated, of the substrate.

In order to achieve the above object, the present invention provides a plating apparatus for a substrate, comprising: a substrate holder for holding a substrate; a cathode unit having a seal member for abutting against and sealing, in a water-tight manner, a peripheral portion of a surface, to be plated, of the substrate held by the substrate holder, and a cathode electrode which is brought into contact with the substrate to supply current to the substrate. An anode which is vertically moveable is disposed in confronting relation to the surface, to be plated, of the substrate; a plating solution impregnated material is disposed between the anode and the surface, to be plated, of the substrate, the plating solution impregnated material being made of a water-retentive material; and a porous member is disposed between the plating solution impregnated material and the surface, to be plated, of the substrate. The plating solution impregnated material is constructed of a plurality of separate members.

According to this plating apparatus, the plating solution impregnated material is disposed on the backside of the porous member and presses the porous member against the surface to be plated of the substrate, and the plating solution impregnated material is constructed of the separate members. With this arrangement, adverse effects such as surface undulations and warpage of the plating solution impregnated material (pressing member) influencing the porous member if the plating solution impregnated material were constructed of a large single component, are reduced, and the entire surface of the porous member can be brought into contact with the surface, to be plated, of the substrate under uniform pressure for plating the substrate without the need for increasing the pressing load.

The separate members of the plating solution impregnated material may be divided by dividing planes extending perpendicularly to the surface, to be plated, of the substrate.

The separate members of the plating solution impregnated material may be divided as grid-like separate members. The grid-like separate members have, for example, square shapes each having sides that are 2 cm long. The grid-like separate members make it easy to fabricate the plating solution impregnated material.

The separate members of the plating solution impregnated material may be divided as triangular separate members. The triangular separate members have, for example, regular triangular shapes each having sides that are 2 cm long. Since the triangular separate members have their plane determined by three points, they are capable of contacting the porous member more uniformly than the grid-like separate members, and suffer less surface undulations and warpage than the grid-like separate members.

The separate members of the plating solution impregnated material may be divided as concentric separate members.

The separate members of the plating solution impregnated material may be divided as sectorial separate members along radial dividing lines.

The separate members of the plating solution impregnated material may be divided as separate members along concentric dividing lines and radial dividing lines.

According to a preferred aspect of the present invention, the plating apparatus further comprises separate member pressing mechanisms for independently pressing the separate members of the plating solution impregnated material against the porous member.

By thus independently applying necessary loads to the respective separate members, the pressing loads may be changed as desired in various location-dependent modes. For example, the porous member may be pressed over its entire surface against the surface to be plated of the substrate under uniform pressure, or the porous member may be pressed against a central region of the surface to be plated of the substrate under a higher pressure and an outer circumferential region of the surface to be plated of the substrate under a lower pressure. This selective pressure application is highly effective in a process where the deposition of the plated film on the substrate varies depending on the magnitude of the load applied to hold the porous member against the substrate.

According to a preferred aspect of the present invention, the anode comprises a plurality of separate members which are identical in shape to the separate members of the plating solution impregnated material and superposed respectively on the separate members of the plating solution impregnated material.

The separate members of the plating solution impregnated material and the separate members of the anode are associated with each other, and they are ganged with each other. In this case, the separate members of the anode are electrically connected parallel to each other.

According to a preferred aspect of the present invention, the plating apparatus further comprises anode pressing mechanisms for independently pressing the separate members of the anode against the plating solution impregnated material.

By thus independently applying necessary loads to the respective separate members of the anode, the pressing loads may be changed as desired in various location-dependent modes. For example, the porous member may be pressed over its entire surface against the surface to be plated of the substrate under uniform pressure, or the porous member may be pressed against a central region of the surface to be plated of the substrate under a higher pressure and an outer circumferential region of the surface to be plated of the substrate W under a lower pressure. Furthermore, by disposing anode pressing mechanisms on the side of the anode remote from the surface to be plated, any extra members are not disposed between the anode and the surface to be plated of the substrate.

According to a preferred aspect of the present invention, the plating solution impregnated material has joint porous members made of a soft water-retentive material and disposed in boundaries between the separate members of the plating solution impregnated material.

The joint porous members thus provided are effective to improve the difference in electric resistance between an electric path through the separate members and an electric path through the boundaries between the separate members, thereby uniformizing the electric resistance of the entire surface to be plated. Furthermore, the separate members and the porous member are held in closer contact with each other, and the plating solution impregnated material is made flexible in its entire shape.

DETAILED DESCRIPTION OF THE PREFERRED EMBODIMENTS

A plating apparatus according to embodiments of the present invention will be described below with reference to the drawings. The following embodiments show examples in which copper as an interconnect material is embedded in fine recesses for interconnects formed in a surface of a substrate such as a semiconductor wafer so as to form interconnects composed of a copper layer. However, it should be noted that other kinds of interconnect materials may be used instead of copper.

Figure 1A:
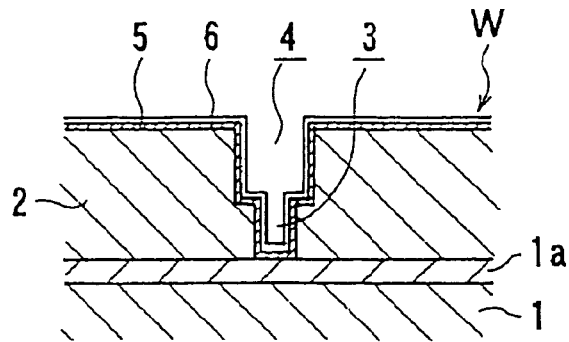
FIGS. 1A through 1D are views showing an example for forming interconnects in the semiconductor device in a sequence of steps.

FIGS. 1A through 1D illustrate an example of forming copper interconnects in a semiconductor device. As shown in FIG. 1A, an insulating film 2, such as an oxide film of $SiO_2$ or a film of low-k material, is deposited on a conductive layer 1a formed on a semiconductor base 1 having formed semiconductor devices. Via holes 3 and interconnect trenches 4 are formed in the insulating film 2 by performing a lithography/etching technique so as to provide fine recesses for interconnects. Thereafter, a barrier layer 5 of TaN or the like is formed on the insulating film 2, and a seed layer 6 as a feeding layer for electroplating is formed on the barrier layer 5 by sputtering or the like.

Figure 1B:
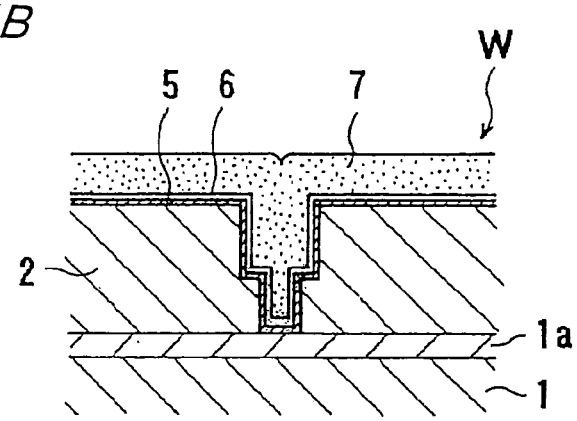
Figure 1C:
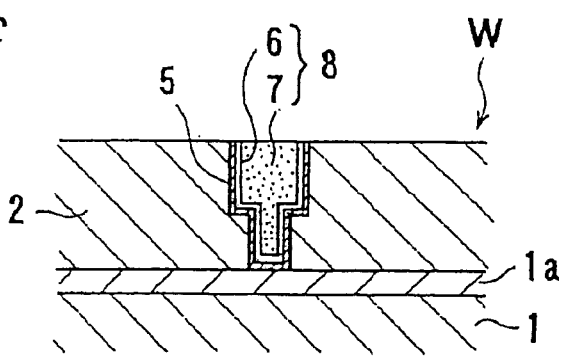

Then, as shown in FIG. 1B, copper plating is performed on a surface of a substrate W to fill the via holes 3 and the interconnect trenches 4 with copper and, at the same time, deposit a copper layer 7 on the insulating film 2. Thereafter, the barrier layer 5, the seed layer 6 and the copper layer 7 on the insulating film 2 are removed by chemical mechanical polishing (CMP) or the like, thus making a surface of plated layer filled in the via holes 3 and the interconnect trenches 4, and a surface of the insulating film 2 lie substantially on the same plane. Interconnects (copper interconnects) 8 composed of the seed layer 6 and the copper 7 are thus formed as shown in FIG. 1C.

Figure 1D:
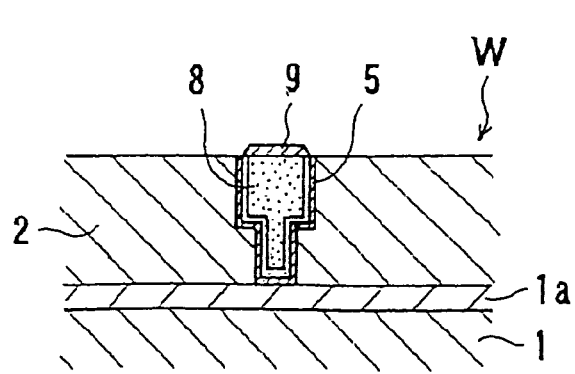

Then, as shown in FIG. 1D, electroless plating is performed on a surface of the substrate W to selectively form a protective film 9 of a Co alloy, an Ni alloy, or the like on surfaces of the interconnects 8, thereby covering and protecting the exposed surfaces of the interconnects 8 with the protective film 9.

Figure 2:
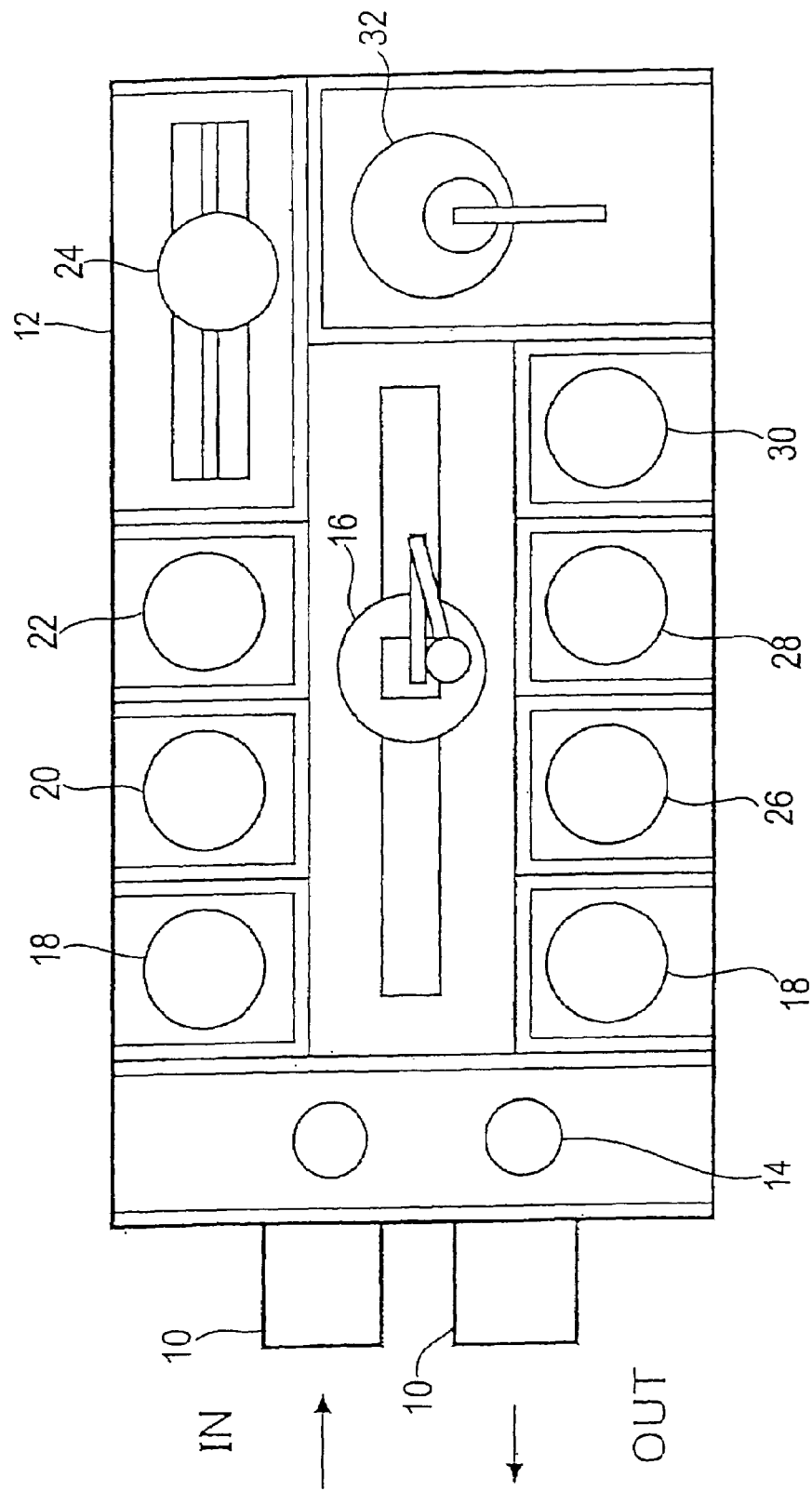
FIG. 2 is a plan view of a substrate processing apparatus having a plating apparatus according to an embodiment of the present invention.

FIG. 2 is a plan view of a substrate processing apparatus incorporating a plating apparatus according to an embodiment of the present invention. As shown in FIG. 2, the substrate processing apparatus comprises a rectangular frame 12 to which transfer boxes 10 such as SMIF (Standard Mechanical Interface) boxes which accommodate a number of substrates such as semiconductor wafers, are removably attached. Inside of the frame 12, there are disposed a loading/unloading station 14, and a movable transfer robot 16 for transferring a substrate to and from the loading/unloading station 14. A pair of plating apparatuses 18 is disposed on both sides of the transfer robot 16. A cleaning and drying apparatus 20, a bevel etching and backside cleaning apparatus 22, and a film thickness measuring instrument 24 are disposed in alignment with each other on one side of the transfer robot 16. On the other side of the transfer robot 16, a heat treatment (annealing) apparatus 26, a pretreatment apparatus 28, an electroless plating apparatus 30, and a polishing apparatus 32 are disposed in alignment with each other.

The frame 12 is shielded so as not to allow a light to transmit therethrough, thereby enabling subsequent processes to be performed under a light-shielded condition in the frame 12. Specifically, the subsequent processes can be performed without irradiating the interconnects with a light such as an illuminating light. By thus preventing the interconnects from being irradiated with a light, it is possible to prevent the interconnects of copper from being corroded due to a potential difference of light that is caused by application of light to the interconnects composed of copper, for example.

Figure 3:
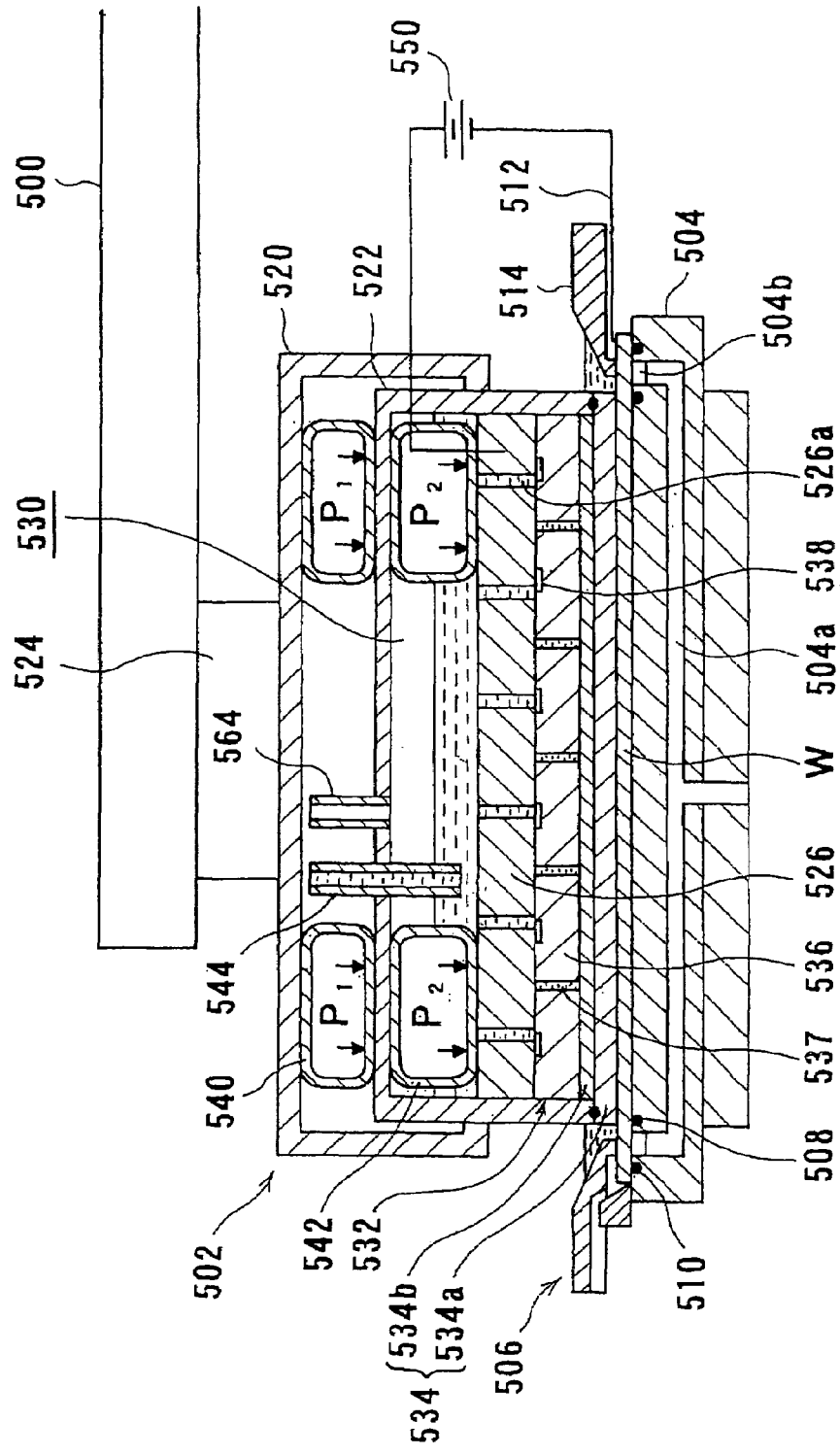
FIG. 3 is a schematic view showing an essential part of the plating apparatus shown in FIG. 2.

FIG. 3 schematically shows the plating apparatus 18. As shown in FIG. 3, the plating apparatus 18 comprises a swing arm 500 which is horizontally swingable. An electrode head 502 is rotatably supported by a tip end portion of the swing arm 500. A substrate holder 504 for holding a substrate W detachably in such a state that a surface, to be plated, of the substrate W faces upwardly is vertically movably disposed below the electrode head 502. A cathode unit 506 is disposed above the substrate holder 504 so as to surround a peripheral portion of the substrate holder 504. In this embodiment, the electrode head 502 whose diameter is slightly smaller than that of the substrate holder 504 is used so that plating can be performed over the substantially entire surface, to be plated, of the substrate W held by the substrate holder 504 without changing a relative position between the electrode head 502 and the substrate holder 504.

An annular vacuum attraction groove 504b communicating with a vacuum passage 504a provided in the substrate holder 504 is formed in a peripheral portion of an upper surface of the substrate holder 504. Seal rings 508 and 510 are provided on inward and outward sides of the vacuum attraction groove 504b, respectively. With the above structure, the substrate W is placed on the upper surface of the substrate holder 504, and the vacuum attraction groove 504b is evacuated through the vacuum passage 504a to attract the peripheral portion of the substrate W, thereby holding the substrate W.

An elevating/lowering motor (not shown) comprising a servomotor and a ball screw (not shown) are used to move the swing arm 500 vertically, and a swinging motor (not shown) is used to rotate (swing) the swing arm 500. Instead of a motor, a pneumatic actuator may be used.

In this embodiment, the cathode unit 506 has the cathode electrodes 512 comprising six cathode electrodes, and the annular seal member 514 disposed above the cathode electrodes 512 so as to cover upper surfaces of the cathode electrodes 512. The seal member 514 has an inner circumferential portion which is inclined inwardly and downwardly so that a thickness of the seal member 514 is gradually reduced. The seal member 514 has an inner circumferential edge portion extending downwardly. With this structure, when the substrate holder 504 is moved upwardly, the peripheral portion of the substrate W held by the substrate holder 504 is pressed against the cathode electrodes 512, thus flowing current to the substrate W. At the same time, the inner circumferential edge portion of the seal member 514 is held in close contact with the upper surface of the peripheral portion of the substrate W to seal a contact portion in a watertight manner. Accordingly, a plating solution that has been supplied onto the upper surface (surface to be plated) of the substrate W is prevented from leaking from the end portion of the substrate W, and the cathode electrodes 512 are thus prevented from being contaminated by the plating solution.

In this embodiment, the cathode unit 506 is not movable vertically, but is rotatable together with the substrate holder 504. However, the cathode unit 506 may be designed to be movable vertically so that the seal member 514 is brought into close contact with the surface, to be plated, of the substrate W when the cathode unit 506 is moved downwardly.

The above-mentioned electrode head 502 comprises a rotatable housing 520 and a vertically movable housing 522 which have a bottomed cylindrical shape with a downwardly open end and are disposed concentrically. The rotatable housing 520 is fixed to a lower surface of a rotating member 524 attached to a free end of the swing arm 500 so that the rotatable housing 520 is rotated together with the rotating member 524. An upper portion of the vertically movable housing 522 is positioned inside the rotatable housing 520, and the vertically movable housing 522 is rotated together with the rotatable housing 520 and is moved relative to the rotatable housing 520 in a vertical direction. The vertically movable housing 522 defines an anode chamber 530 by closing the lower open end of the vertically movable housing 522 with a plating solution impregnated material 532 and a porous member 534 so that a disk-like anode 526 is disposed in the anode chamber 530 and is dipped in a plating solution which is introduced to the anode chamber 530.

The plating solution impregnated material 532 is mainly used for holding a plating solution. The plating solution impregnated material is composed of porous ceramics such as alumina, SiC, mullite, zirconia, titania or cordierite, or a hard porous member such as a sintered compact of polypropylene or polyethylene, or a composite material comprising these materials, or a water-retentive material such as a woven fabric or a non-woven fabric. In case of the alumina-based ceramics, for example, the ceramics with a pore diameter of 30 to 200 μm is used. In case of the SiC, SiC with a pore diameter of not more than 30 μm, a porosity of 20 to 95%, and a thickness of about 1 to 20 mm, preferably 5 to 20 mm, more preferably 8 to 15 mm, is used. The plating solution impregnated material 532, in this embodiment, is composed of porous ceramics of alumina having a porosity of 30%, and an average pore diameter of 100 μm. The porous ceramic plate per se is an insulator, but is constructed so as to have a smaller conductivity than the plating solution by causing the plating solution to enter its interior complicatedly and follow a considerably long path in the thickness direction.

In this manner, the plating solution impregnated material 532 is disposed in the anode chamber 530, and generates high resistance. Hence, the influence of the resistance of the copper layer 7 (see FIG. 1A) becomes a negligible degree. Consequently, the difference in current density over the surface of the substrate due to electrical resistance on the surface of the substrate W becomes small, and the uniformity of the plated film over the surface of the substrate improves.

Figure 4:
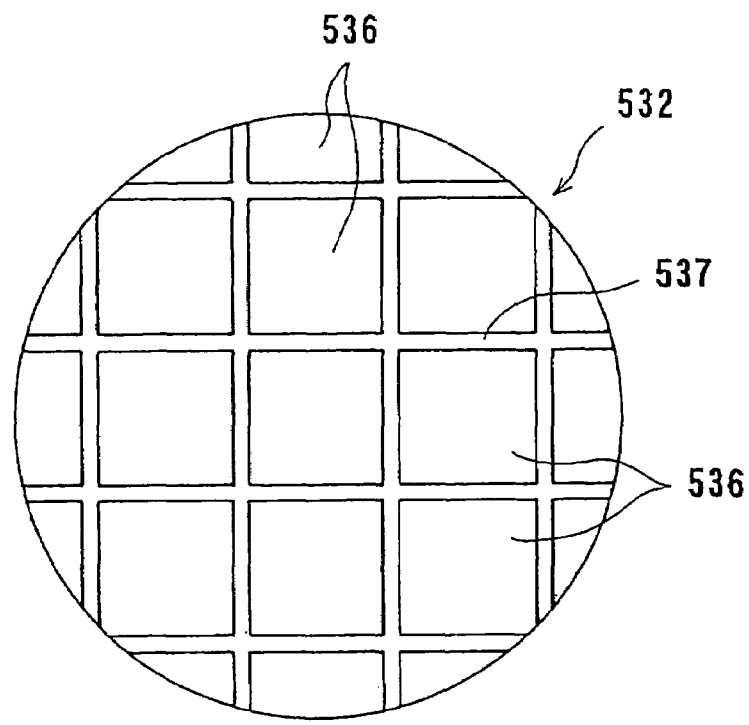
FIG. 4 is a plan view of a plating solution impregnated material of the plating apparatus shown in FIG. 3.
Figure 5:
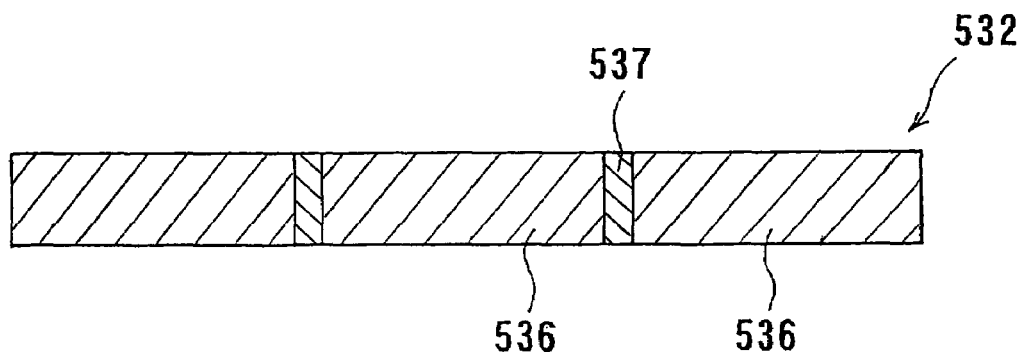
FIG. 5 is an enlarged cross-sectional view of the plating solution impregnated material of the plating apparatus shown in FIG. 3.

As shown in FIG. 4, the plating solution impregnated material 532 comprises a number of grid-like separate members 536 which are divided into square shapes each having sides that are 2 cm long, by dividing planes extending perpendicularly to the surface (to be plated) of the substrate W that are held by the substrate holder 504. As shown in detail in FIG. 5, joint porous members 537 made of a water-retentive material and softer than the separate members 536 are disposed in the boundaries between the separate members 536, joining the separate members 536 together. The joint porous members 537 are made of porous polyurethane, for example.

Since the plating solution impregnated material 532 is constructed of the separate members 536, when the plating solution impregnated material 532 presses the porous member 534 against the surface to be plated of the substrate W, even if the plating solution impregnated material 532 has undulations and warpage on its entire surface, these undulations and warpage are absorbed by the separate members 536 as they are displaced relative to each other along the dividing planes. Therefore, the entire surface of the porous member 534 can be held in contact with the surface to be plated of the substrate W under uniform pressure without the need for increasing the load that is applied to press the porous member 534 against the surface to be plated of the substrate W.

If the plating solution impregnated material were constructed of a large single component, then when the plating solution impregnated material presses the porous member against the surface to be plated of the substrate, if the plating solution impregnated material has undulations and warpage on its surface, these undulations and warpage would cause the plating solution impregnated material to be tilted or vertically moved in its entirety. It would thus be difficult to press and contact the entire surface of the porous member uniformly against the surface to be plated of the substrate. Accordingly, local gaps would tend to be created between the porous member and the surface to be plated of the substrate, resulting in in-plane irregularities of the plated film. To prevent such a shortcoming from occurring, it would be necessary to increase the load applied to bring the porous member into contact with the surface to be plated. According to this embodiment, since the plating solution impregnated material 532 is constructed of the separate members 536, as described above, it can hold the entire surface of the porous member 534 in contact with the surface to be plated of the substrate W under uniform pressure without the need for an increase in the pressing load.

Furthermore, the joint porous members 537 made of a soft water-retentive material are disposed in the boundaries between the separate members 536, joining the separate members 536 together. The joint porous members 537 thus provided are effective to improve the difference in electric resistance between an electric path through the separate members 536 and an electric path through the boundaries between the separate members 536, i.e., the joint porous members 537, thereby making uniform the electric resistance of the entire surface to be plated. Furthermore, the separate members 536 and the porous member 534 are held in closer contact with each other, and the plating solution impregnated material 532 is made flexible in its entire shape.

Figure 6:
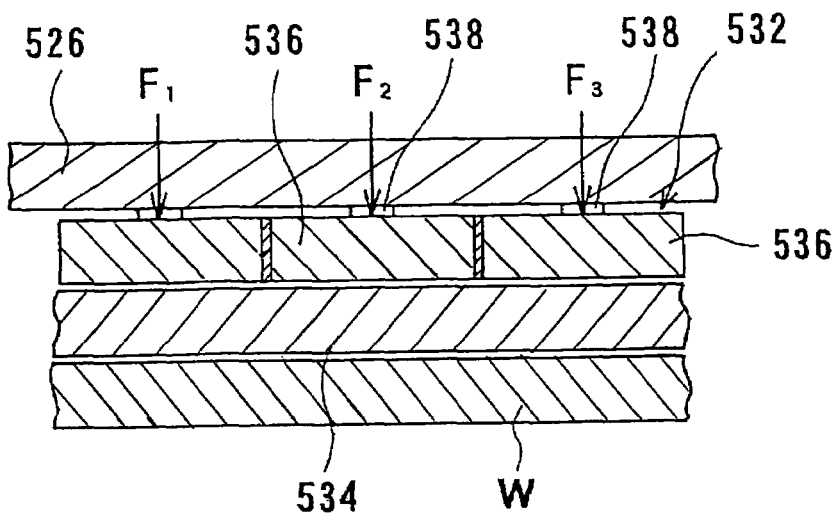
FIG. 6 is a cross-sectional view of a substrate, a porous member, piezoelectric elements, the plating solution impregnated material, and an anode of the plating apparatus shown in FIG. 3.

According to this embodiment, as shown in detail in FIG. 6, piezoelectric elements 538 are disposed between the separate members 536 and the anode 526 as separate member pressing mechanisms for independently pressing the separate members 536 against the porous member 534. Voltages applied to the respective piezoelectric elements 538 are separately selected to enable the piezoelectric elements 538 to press the separate members 536 under independent pressures $F_1$, $F_2$, $F_3$, as shown in FIG. 6.

By thus independently applying necessary loads to the respective separate members 536 of the plating solution impregnated material 532, the pressing loads may be changed as desired in various location-dependent modes. For example, the porous member 534 may be pressed over its entire surface against the surface to be plated of the substrate W under uniform pressure, or the porous member 534 may be pressed against a central region of the surface to be plated of the substrate W under a higher pressure and an outer circumferential region of the surface to be plated of the substrate W under a lower pressure. This selective pressure application is highly effective in a process where the deposition of the plated film on the substrate varies depending on the magnitude of the load applied to bring the porous member 534 into contact with the substrate W.

Figure 7:
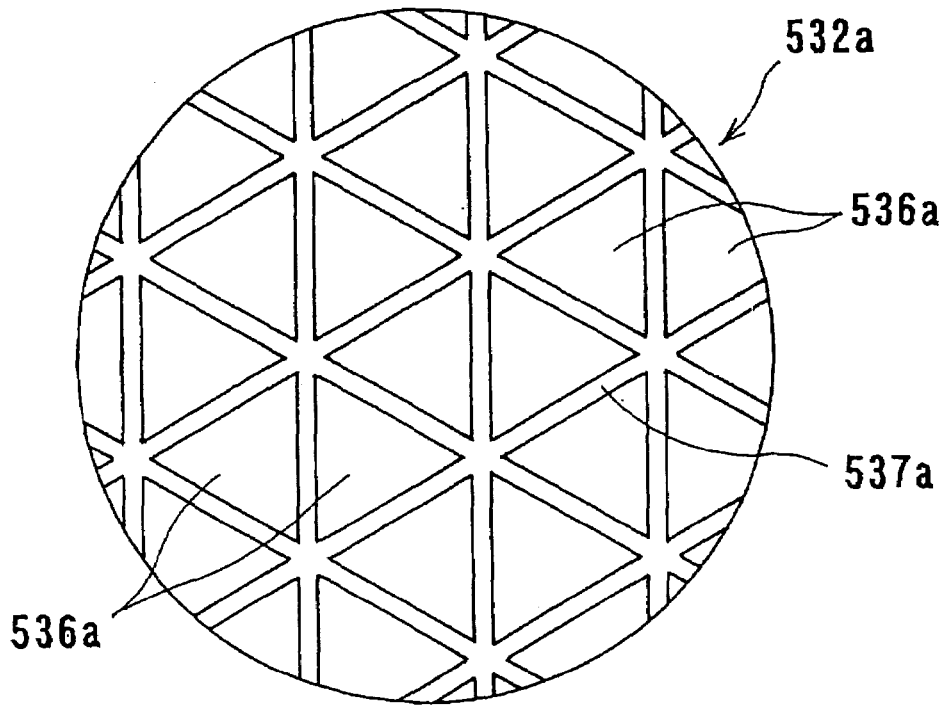
FIG. 7 is a plan view of another plating solution impregnated material.

In the above embodiment, the rectangular separate members 536 are joined together by the joint porous members 537, thereby forming the plating solution impregnated material 532. However, as shown in FIG. 7, a number of separate members 536*a* which are divided into regular triangular shapes each having sides that are 2 cm long may be joined together by joint porous members 537*a*, thereby forming a plating solution impregnated material 532*a*. Since the triangular separate members 536*a* have their plane determined by three points, they are capable of contacting the porous member 534 more uniformly than the grid-like separate members, and suffer less surface undulations and warpage than the grid-like separate members.

Figure 8:
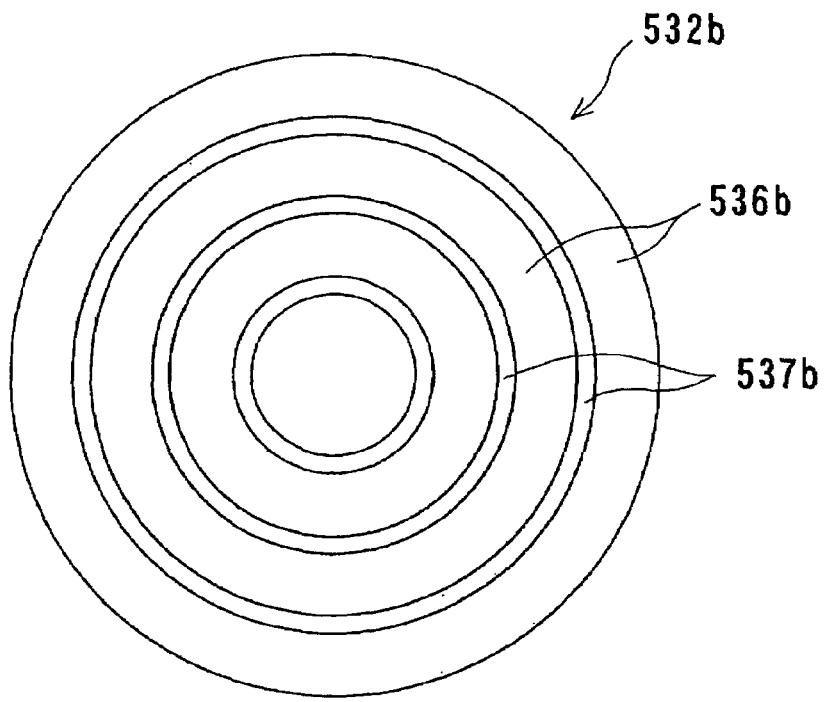
FIG. 8 is a plan view of still another plating solution impregnated material.
Figure 9:
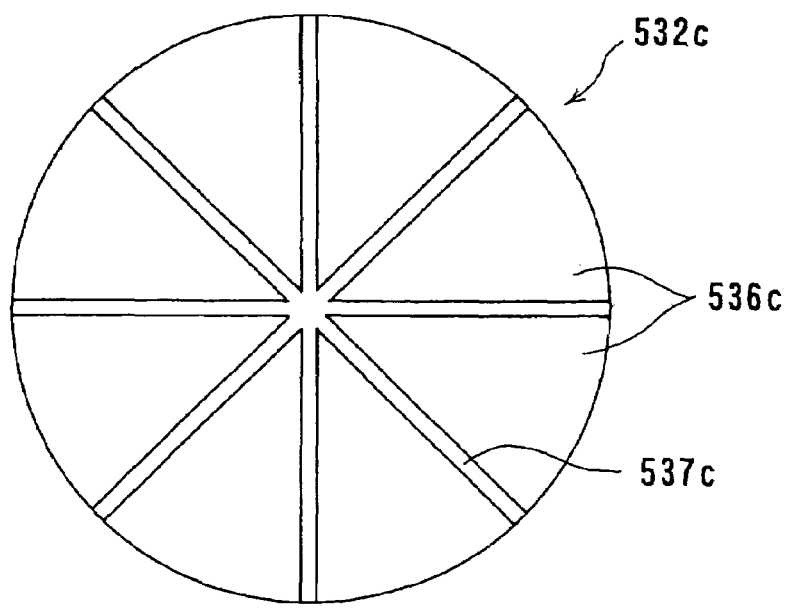
FIG. 9 is a plan view of yet another plating solution impregnated material.
Figure 10:
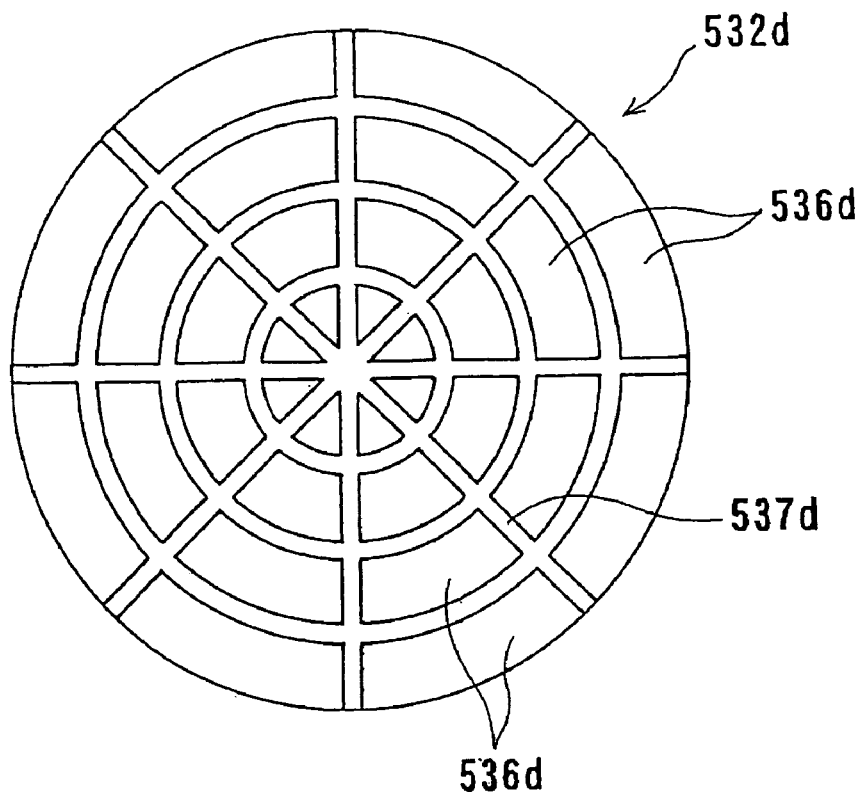
FIG. 10 is a plan view of yet still another plating solution impregnated material.

Alternatively, as shown in FIG. 8, a number of annular concentric separate members 536*b* may be joined together by annular concentric joint porous members 537*b*, thereby forming a plating solution impregnated material 532*b*. FIG. 9 shows another plating solution impregnated material 532*c* produced by joining together a number of sectorial separate members 536*c*, which are separate along radial dividing lines, with joint porous members 537*c*. Still another plating solution impregnated material 532*d* shown in FIG. 10 is produced by joining together a number of separate members 536*d*, which are separate along concentric dividing lines and radial dividing lines, with joint porous members 537*d*.

In this embodiment, the porous member 534 comprises a lower pad 534*a* adapted to be brought into direct contact with the substrate W, and an upper pad 534*b* disposed between the lower pad 534*a* and the plating solution impregnated material 532. The plating solution impregnated material 532 and the upper pad 534*b* are positioned in the vertically movable housing 522, and the lower open end of the vertically movable housing 522 is closed by the lower pad 534*a*. Thus, it is possible to use the lower pad 534*a* which contacts the substrate, and has flatness enough to flatten irregularities on the surface, to be plated, of the substrate.

The lower pad 534*a* is required to have the contact surface adapted to contact the surface (surface to be contacted) of the substrate W and having a certain degree of flatness, and to have fine through-holes therein for allowing the plating solution to pass therethrough. It is also necessary that at least the contact surface of the lower pad 534*a* be made of an insulator or a material having high insulating properties. The surface of the lower pad 534*a* is required to have a maximum roughness (RMS) of about several tens µm or less.

It is desirable that the fine through-holes of the lower pad 534*a* have a circular cross section in order to maintain flatness of the contact surface. An optimum diameter of each of the fine through-holes and the optimum number of the fine through-holes per unit area vary depending on the kind of a plated film and an interconnect pattern. However, it is desirable that both the diameter and the number are as small as possible in view of improving selectivity of a plated film which is growing in a recess. Specifically, the diameter of each of the fine through-holes may be not more than 30 µm, preferably in the range of 5 to 20 µm. The number of the fine through-holes having such diameter per unit area may be represented by a porosity of not more than 50%.

Further, it is desirable that the lower pad 534*a* has a certain degree of hardness. For example, the lower pad 534*a* may have a tensile strength ranging from 5 to 100 kg/cm$^2$ and a bend elastic constant ranging from 200 to 10000 kg/cm$^2$.

Furthermore, it is desirable that the lower pad 534*a* is made of hydrophilic material. For example, the following materials may be used after being subjected to hydrophilization or being introduced with a hydrophilic group by polymerization. Examples of such materials include porous polyethylene (PE), porous polypropylene (PP), porous polyamide, porous polycarbonate, and porous polyimide. The porous polyethylene (PE), the porous polypropylene (PP), the porous polyamide, and the like are produced by using fine powder of ultrahigh-molecular polyethylene, polypropylene, and polyamide, or the like as a material, squeezing the fine powder, and sintering and forming the squeezed fine powder. These materials are commercially available. For example, "Furudasu S (trade name)" manufactured by Mitsubishi Plastics, Inc, "Sunfine UF (trade name)", "Sunfine AQ (trade name)", both of which are manufactured by Asahi Kasei Corporation, and "Spacy (trade name)" manufactured by Spacy Chemical Corporation are available on the market. The porous polycarbonate may be produced by passing a high-energy heavy metal such as copper, which has been accelerated by an accelerator, through a polycarbonate film to form straight tracks, and then selectively etching the tracks.

The lower pad 534*a* may be produced by a flattening process in which the surface, to be brought into contact with the surface of the substrate W, of the lower pad 534*a* is compacted or machined to a flat finish for thereby enabling a high-preferential deposition in the fine recesses.

The electrode head 502 has a housing pressing mechanism comprising an air bag 540 for downwardly pressing the vertically movable housing 522 and an anode pressing mechanism comprising an air bag 542 for downwardly pressing the anode 526. Specifically, in this embodiment, a ring-shaped air bag (housing pressing mechanism) 540 is provided between the lower surface of the top wall of the rotatable housing 520 and the upper surface of the top wall of the vertically movable housing 522, and a ring-shaped air bag (anode pressing mechanism) 542 is provided in the anode chamber 530 and between the vertically movable housing 522 and the anode 526. These air bags 540 and 542 are connected to a pressurized fluid source through respective pressurized fluid introduction pipes (not shown).

With this arrangement, the swing arm 500 is fixed at a predetermined position (process location) so as not to move vertically, and then the interior of the air bag 540 is pressurized under a pressure of $P_1$, and the interior of the air bag 542 is pressurized under a pressure of $P_2$, whereby the lower pad 534a is pressed against the surface (surface to be plated) of the substrate W held by the substrate holder 504 under a desired pressure uniformly. Thereafter, the pressures $P_1$ and $P_2$ are restored to an atmospheric pressure to separate the lower pad 534a from the surface of the substrate W.

Figure 11:
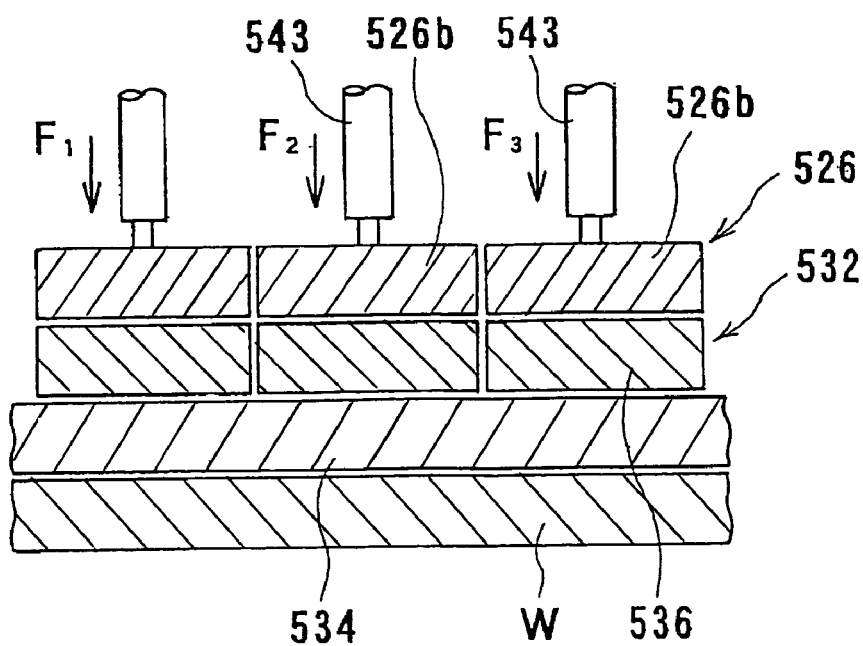
FIG. 11 is a cross-sectional view of another anode, cylinders as anode pressing mechanisms, a plating solution impregnated material, a porous member, and a substrate.

In this embodiment, the anode 526 in the form of a single plate is pressed by the single air bag 542. However, as shown in FIG. 11, the anode 526 may comprise a plurality of separate members 526b which are identical in shape to the separate members 536 of the plating solution impregnated material 532 and superposed respectively on the separate members 536. The separate members 536 of the plating solution impregnated material 532 and the separate members 526b of the anode 526 may be associated with each other, and the associated separate members 536, 526b are grouped with each other, and cylinders 543, rather than the piezoelectric elements 538, serving as anode pressing mechanisms for independently pressing the separate members 526b against the plating solution impregnated material 532 may be connected to the respective separate members 526b. In this case, the separate members 526b of the anode 526 are electrically connected parallel to each other.

The different pressing loads, such as $F_1$, $F_2$, $F_3$, may be applied independently to each separate member 526b of the anode 526 to change in various location-dependent modes as desired. For example, the porous member 534 may be pressed over its entire surface against the surface to be plated of the substrate W under uniform pressure, or the porous member 534 may be pressed against a central region of the surface to be plated of the substrate W under a higher pressure and an outer circumferential region of the surface to be plated of the substrate W under a lower pressure. As the cylinders (anode pressing mechanisms) 543 are disposed on the side of the anode 526 remote from the surface to be plated, any extra members such as piezoelectric elements or the like are not disposed between the anode 526 and the substrate W held by the substrate holder 504.

A plating solution introduction pipe 544 is attached to the vertically movable housing 522 to introduce the plating solution into the vertically movable housing 522, and a pressurized fluid introduction pipe 564 is attached to the vertically movable housing 522 to introduce a pressurized fluid into the vertically movable housing 522. A number of pores 526a are formed within the anode 526. Thus, a plating solution is introduced from the plating solution introduction pipe 544 into the anode chamber 530, and the interior of the anode chamber 530 is pressurized, whereby the plating solution reaches the upper surface of the plating solution impregnated material 532 through the pores 526a of the anode 526, and reaches the upper surface of the substrate W held by the substrate holder 504 through the interior of the plating solution impregnated material 532 and interior of the porous member 534 (the upper pad 534b and the lower pad 534a).

For example, in the case of performing copper plating, in order to suppress slime formation, the anode 526 is made of copper (phosphorus-containing copper) containing 0.03 to 0.05% of phosphorus. The anode 526 may comprise an insoluble metal such as platinum or titanium, or an insoluble electrode comprising metal on which platinum or the like is plated, for example, titanium on which iridium is coated. With the anode 526 being thus made of an insoluble material (an insoluble electrode), the anode 526 does not need to be replaced, and it is possible to prevent the generation of particles produced by the peeling off of a black film which would occur if a soluble anode were employed. Further, the anode 526 may be a net-like anode which allows a plating solution to pass therethrough easily.

The cathode electrodes 512 are electrically connected to a cathode of a plating power source 550, and the anode 526 is electrically connected to an anode of the plating power source 550.

Next, an operation for conducting plating using the plating apparatus will be described. First, in a state in which the substrate W is attracted to and held by the upper surface of the substrate holder 504, the substrate holder 504 is raised to bring the peripheral portion of the substrate W into contact with the cathode electrodes 512, thus making it possible to supply current to the substrate W. Then, the substrate holder 504 is further raised to press the seal member 514 against the upper surface of the peripheral portion of the substrate W, thereby sealing the peripheral portion of the substrate W in a watertight manner.

On the other hand, the electrode head 502 is moved from a position (idling position) where replacement of the plating solution, removal of bubbles, and the like are conducted by idling to a predetermined position (process position) in such a state that the plating solution is held inside the electrode head 502. Specifically, the swing arm 500 is once raised and further swung, whereby the electrode head 502 is located right above the substrate holder 504. Thereafter, the electrode head 502 is lowered, and when the electrode head 502 reaches the predetermined position (process position), the electrode head 502 is stopped. Then, the anode chamber 530 is pressurized, and the plating solution held by the electrode head 502 is discharged from the lower surface of the porous member 534.

Then, pressurized air is introduced into the air bags 540, 542 to press the lower pad 534a downwardly. In this embodiment, furthermore, voltages are applied to the respective piezoelectric elements 538 disposed between the separate members 536 and the anode 526 for individually pressing the separate members 536 downwardly, if necessary, thereby to press the entire surface of the porous member 534 against the surface to be plated of the substrate W under uniform forces. If necessary, at this time, the electrode head 502 and the substrate holder 504 are rotated about their own axes respectively, and the entire surface of the lower pad 534a is uniformly pressed into close contact with the surface to be plated of the substrate W.

Next, the cathode electrodes 512 are connected to the cathode of the plating power source 550 and the anode 526 is connected to the anode of the plating power source 550, thereby plating the surface of the substrate W.

After plating is performed for a certain period of time, the cathode electrodes 512 and the anode 526 are disconnected from the plating power source 550, and application of voltages to piezoelectric elements 538 is stopped. The anode chamber 530 is restored to an atmospheric pressure, and the air bags 540, 542 and 546 are restored to an atmospheric pressure, thereby separating the lower pad 534a from the substrate W. Then, the electrode head 502 is raised.

The above operation is repeated a predetermined number of times, if necessary, and the copper layer 7 (see FIG. 1B)

having a sufficient thickness enough to fill fine recesses for interconnects is formed on the surface (surface to be plated) of the substrate W, and then the electrode head 502 is rotated to be returned to its original position (idling position).

Figure 12:
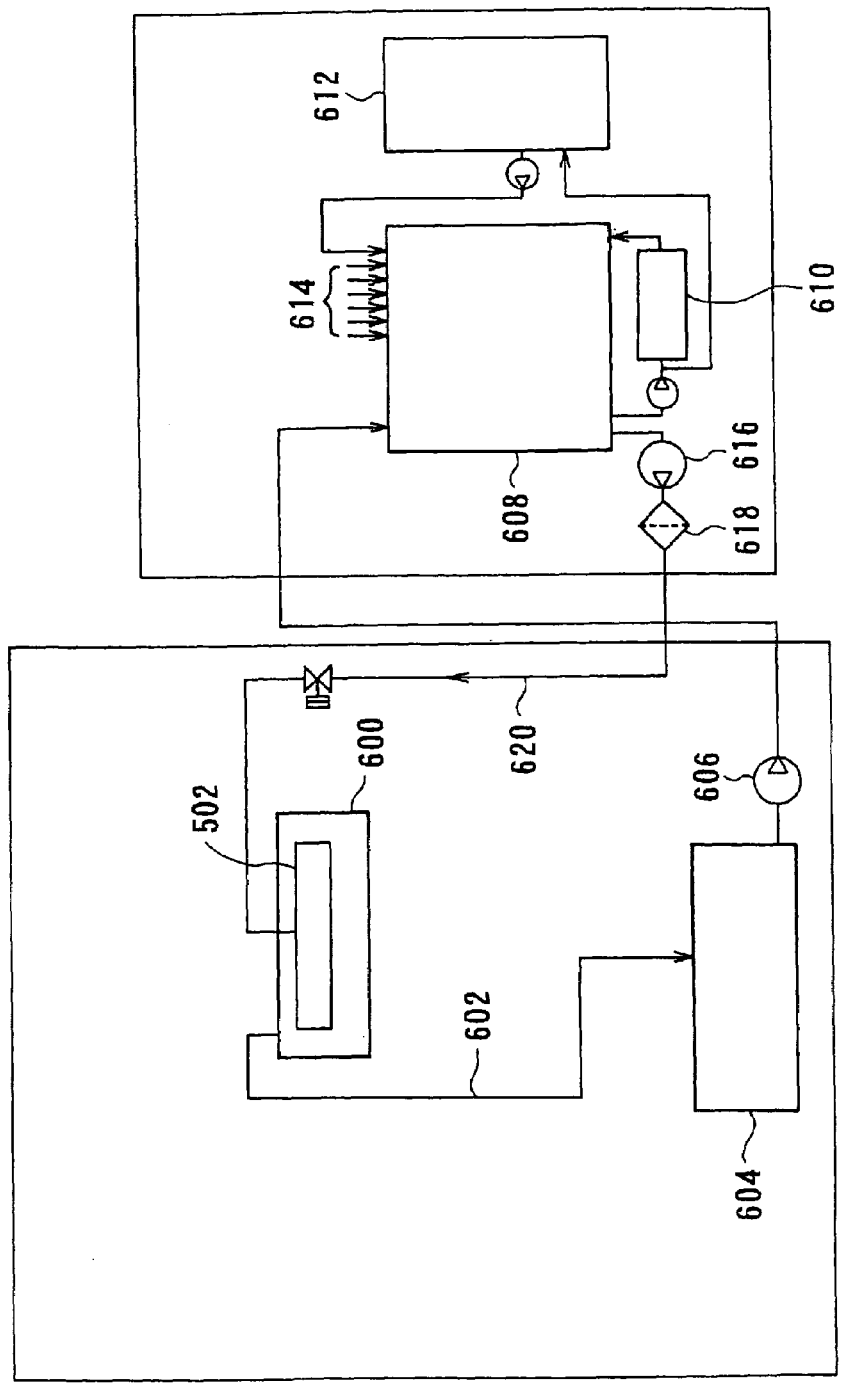
FIG. 12 is a systematic diagram showing an example of a plating solution management system.

FIG. 12 shows a plating solution management and supply system for supplying a plating solution whose composition, temperature, and the like are controlled to the plating apparatus 18. As shown in FIG. 12, a plating solution tray 600 for allowing the electrode head 502 of the plating apparatus 18 to be immersed for idling is provided, and the plating solution tray 600 is connected to a reservoir 604 through a plating solution discharge pipe 602. The plating solution discharged through the plating solution discharge pipe 602 flows into the reservoir 604.

The plating solution which has flowed into the reservoir 604 is introduced into the plating solution regulating tank 608 by operating a pump 606. This plating solution regulating tank 608 is provided with a temperature controller 610, and a plating solution analyzing unit 612 for sampling the plating solution and analyzing the sample solution. Further, component replenishing pipes 614 for replenishing the plating solution with components which are found to be insufficient by an analysis performed by the plating solution analyzing unit 612 are connected to the plating solution regulating tank 608. When a pump 616 is operated, the plating solution in the plating solution regulating tank 608 flows in the plating solution supply pipe 618, passes through the filter 620, and is then returned to the plating solution tray 600.

In this manner, the composition and temperature of the plating solution is adjusted to be constant in the plating solution regulating tank 608, and the adjusted plating solution is supplied to the electrode head 502 of the plating apparatus 18. Then, by holding the adjusted plating solution by the electrode head 502, the plating solution having constant composition and temperature at all times can be supplied to the electrode head 502 of the plating apparatus 18.

Figure 13:
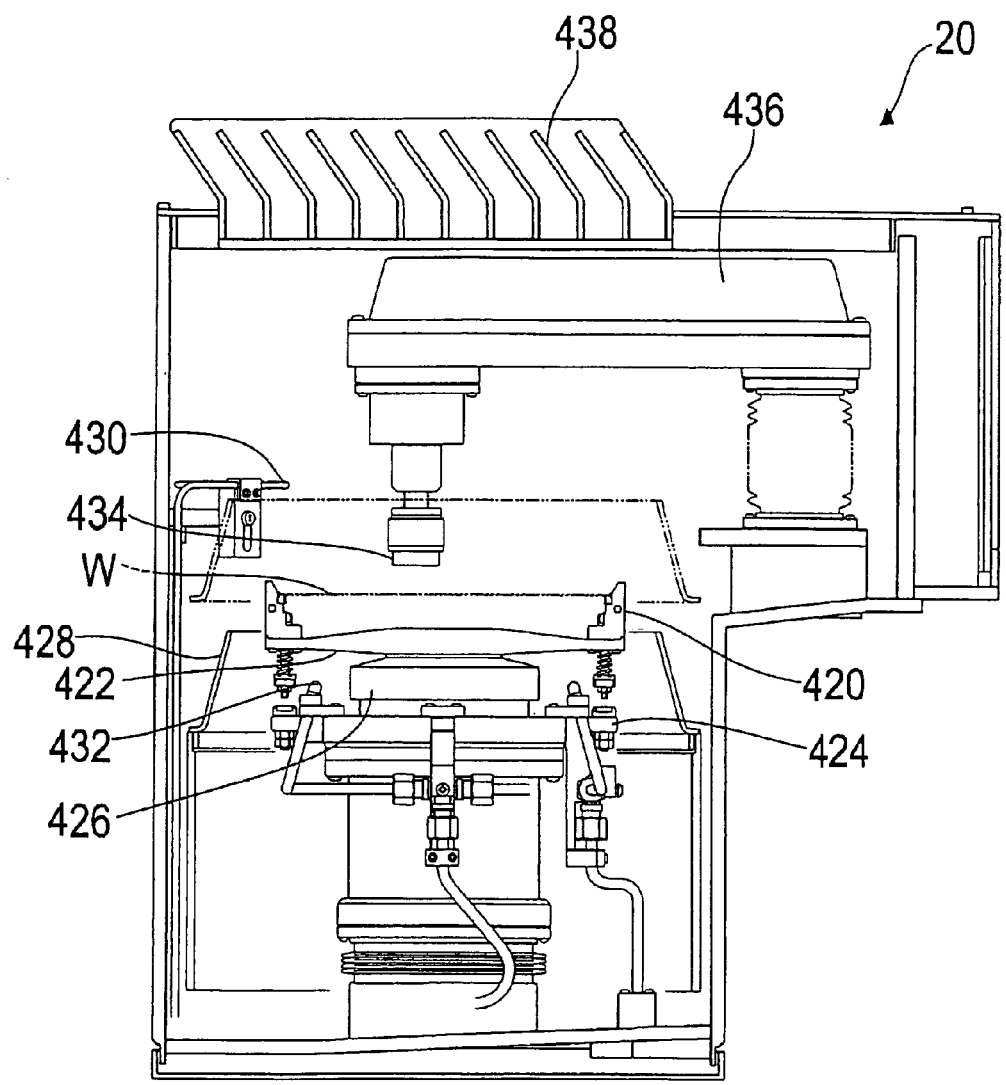
FIG. 13 is a front cross-sectional view showing an example of a cleaning and drying apparatus shown in FIG. 2.
Figure 14:
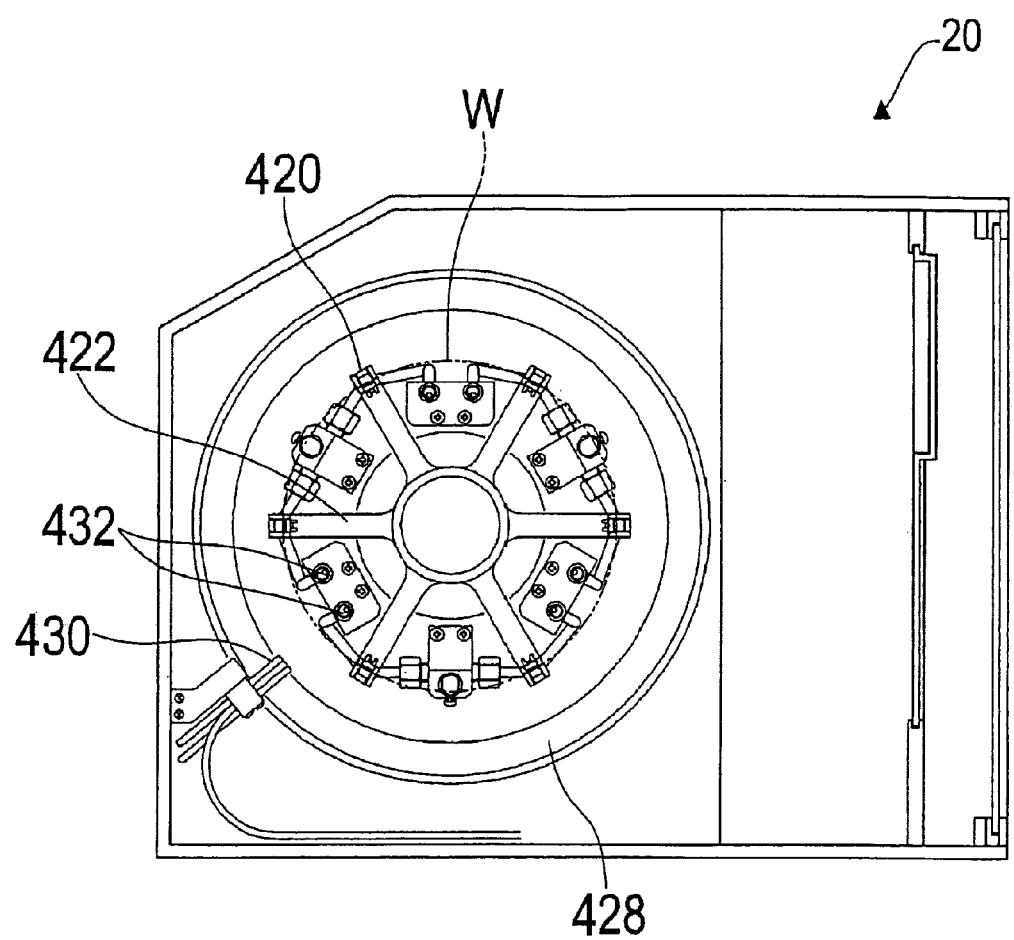
FIG. 14 is a plan view showing an example of the cleaning and drying apparatus shown in FIG. 2.

FIGS. 13 and 14 show an example of a cleaning and drying apparatus 20 for cleaning (rinsing) and drying the substrate. Specifically, the cleaning and drying apparatus 20 performs chemical cleaning and pure water cleaning (rinsing) first, and then completely drying the substrate W which has been cleaned by spindle rotation. The cleaning and drying apparatus 20 comprises a substrate holder 422 having a clamp mechanism 420 for clamping an edge portion of the substrate W, and a substrate mounting and removing lifting/lowering plate 424 for opening and closing the clamp mechanism 420.

The substrate holder 422 is coupled to an upper end of a spindle 426 which is rotated at a high speed by energizing a spindle rotating motor (not shown). Further, a cleaning cup 428 for preventing a treatment liquid from being scattered around is disposed around the substrate W held by the clamp mechanism 420, and the cleaning cup 428 is vertically moved by actuation of a cylinder (not shown).

Further, the cleaning and drying apparatus 20 comprises a chemical liquid nozzle 430 for supplying a treatment liquid to the surface of the substrate W held by the clamp mechanism 420, a plurality of pure water nozzles 432 for supplying pure water to the backside surface of the substrate W, and a pencil-type cleaning sponge 434 which is disposed above the substrate W held by the clamp mechanism 420 and is rotatable. The pencil-type cleaning sponge 434 is attached to a free end of a swing arm 436 which is swingable in a horizontal direction. Clean air introduction ports 438 for introducing clean air into the apparatus are provided at the upper part of the cleaning and drying apparatus 20.

With the cleaning and drying apparatus 20 having the above structure, the substrate W is held by the clamp mechanism 420 and is rotated by the clamp mechanism 420, and while the swing arm 436 is swung, a treatment liquid is supplied from the chemical liquid nozzle 430 to the cleaning sponge 434, and the surface of the substrate W is rubbed with the pencil-type cleaning sponge 434, thereby cleaning the surface of the substrate W. Further, pure water is supplied to the backside surface of the substrate W from the pure water nozzles 432, and the backside surface of the substrate W is simultaneously cleaned (rinsed) by the pure water ejected from the pure water nozzles 432. Thus cleaned substrate W is spin-dried by rotating the spindle 426 at a high speed.

Figure 15:
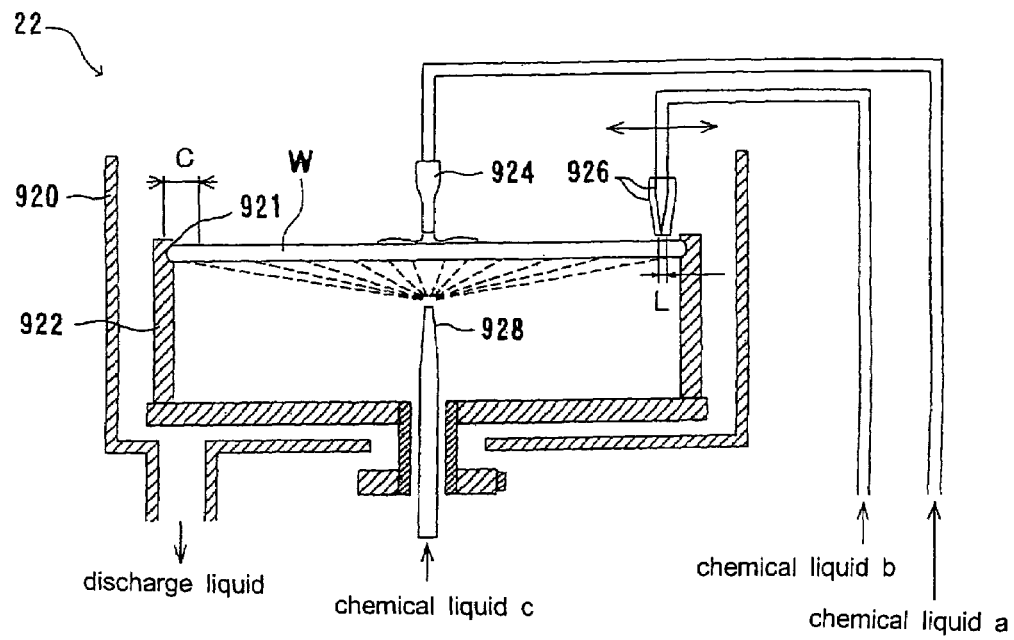
FIG. 15 is a schematic view showing an example of a bevel etching and backside cleaning apparatus shown in FIG. 2.

FIG. 15 shows an example of a bevel etching and backside cleaning apparatus 22. The bevel etching and backside cleaning apparatus 22 can perform etching of the copper layer 7 (see FIG. 1B) deposited on an edge (bevel) of the substrate and backside cleaning simultaneously, and can suppress growth of a natural oxide film of copper at the circuit formation portion on the surface of the substrate. The bevel etching and backside cleaning apparatus 22 has a substrate holder 922 positioned inside a bottomed cylindrical waterproof cover 920 and adapted to rotate the substrate W at a high speed, in such a state that the face of the substrate W faces upward, while holding the substrate W horizontally by spin chucks 921 at a plurality of locations along a circumferential direction of a peripheral edge portion of the substrate, a center nozzle 924 placed above a nearly central portion of the face of the substrate W held by the substrate holder 922, and an edge nozzle 926 placed above the peripheral edge portion of the substrate W. The center nozzle 924 and the edge nozzle 926 are directed downward. A back nozzle 928 is positioned below a nearly central portion of the backside of the substrate W, and directed upward. The edge nozzle 926 is adapted to be movable in a diametrical direction and a height direction of the substrate W.

The width of movement L of the edge nozzle 926 is set such that the edge nozzle 926 can be arbitrarily positioned in a direction toward the center from the outer peripheral end surface of the substrate, and a value for L is inputted according to the size, usage, or the like of the substrate W. Normally, an edge cut width C is set in the range of 2 mm to 5 mm. In the case where a rotational speed of the substrate is a certain value or higher at which the amount of liquid migration from the backside to the face is not problematic, the copper layer, and the like within the edge cut width C can be removed.

Next, the method of cleaning with this bevel etching and backside cleaning apparatus 22 will be described. First, the substrate is horizontally rotated integrally with the substrate holder 922, with the substrate being held horizontally by the spin chucks 921 of the substrate holder 922. In this state, an acid solution is supplied from the center nozzle 924 to the central portion of the face of the substrate W. The acid solution may be a non-oxidizing acid, and hydrofluoric acid, hydrochloric acid, sulfuric acid, citric acid, oxalic acid, or the like is used. On the other hand, an oxidizing agent solution is supplied continuously or intermittently from the edge nozzle 926 to the peripheral edge portion of the substrate W. As the oxidizing agent solution, one of an aqueous solution of ozone, an aqueous solution of hydrogen peroxide, an aqueous solution of nitric acid, and an aqueous solution of sodium hypochlorite is used, or a combination thereof is used.

In this manner, the copper layer, or the like formed on the upper surface and end surface in the region of the edge cut width C of the substrate W is rapidly oxidized with the oxidizing agent solution, and is simultaneously etched with the acid solution supplied from the center nozzle 924 and spread on the entire face of the substrate, whereby it is dissolved and removed. By mixing the acid solution and the oxidizing agent solution at the peripheral edge portion of the substrate, a steep etching profile can be obtained, in comparison with a mixture of them which is produced in advance being supplied. At this time, the copper etching rate is determined by their concentrations. If a natural oxide film of copper is formed in the circuit-formed portion on the face of the substrate, this natural oxide is immediately removed by the acid solution spreading on the entire face of the substrate according to rotation of the substrate, and does not grow any more. After the supply of the acid solution from the center nozzle 924 is stopped, the supply of the oxidizing agent solution from the edge nozzle 926 is stopped. As a result, silicon exposed on the surface is oxidized, and deposition of copper can be suppressed.

On the other hand, an oxidizing agent solution and a silicon oxide film etching agent are supplied simultaneously or alternately from the back nozzle 928 to the central portion of the backside of the substrate. Therefore, copper or the like adhering in a metal form to the backside of the substrate W can be oxidized with the oxidizing agent solution, together with silicon of the substrate, and can be etched and removed with the silicon oxide film etching agent. This oxidizing agent solution is preferably the same as the oxidizing agent solution supplied to the face, because the types of chemicals are decreased in number. Hydrofluoric acid can be used as the silicon oxide film etching agent, and if hydrofluoric acid is used as the acid solution on the face of the substrate, the types of chemicals can be decreased in number. Thus, if the supply of the oxidizing agent is stopped first, a hydrophobic surface is obtained. If the etching agent solution is stopped first, a water-saturated surface (a hydrophilic surface) is obtained, and thus the backside surface can be adjusted to a condition that will satisfy the requirements of a subsequent process.

In this manner, the acid solution, i.e., etching solution is supplied to the substrate W to remove metal ions remaining on the surface of the substrate W. Then, pure water is supplied to replace the etching solution with pure water and remove the etching solution, and then the substrate is dried by spin-drying. In this way, removal of the copper layer in the edge cut width C at the peripheral edge portion on the face of the substrate, and removal of copper contaminants on the backside are performed simultaneously to thus allow this treatment to be completed, for example, within 80 seconds. The etching cut width of the edge can be set arbitrarily (from 2 to 5 mm), but the time required for etching does not depend on the cut width.

Figure 16:
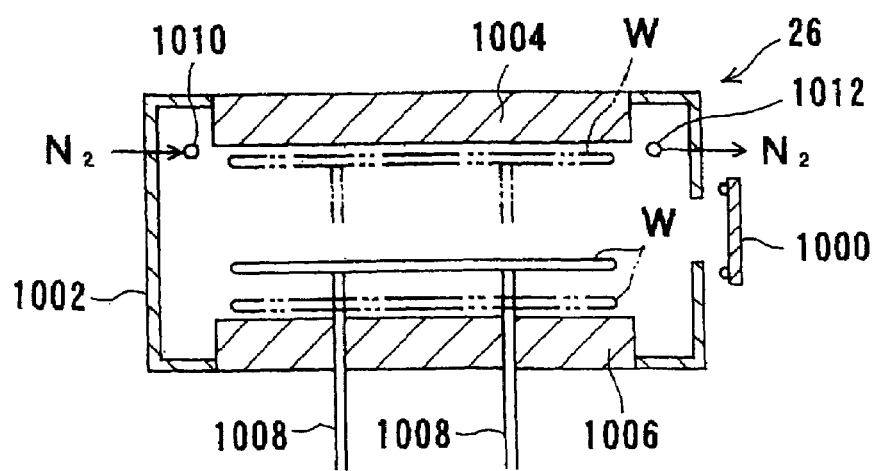
FIG. 16 is a plan cross-sectional view showing an example of a heating treatment apparatus shown in FIG. 2.
Figure 17:
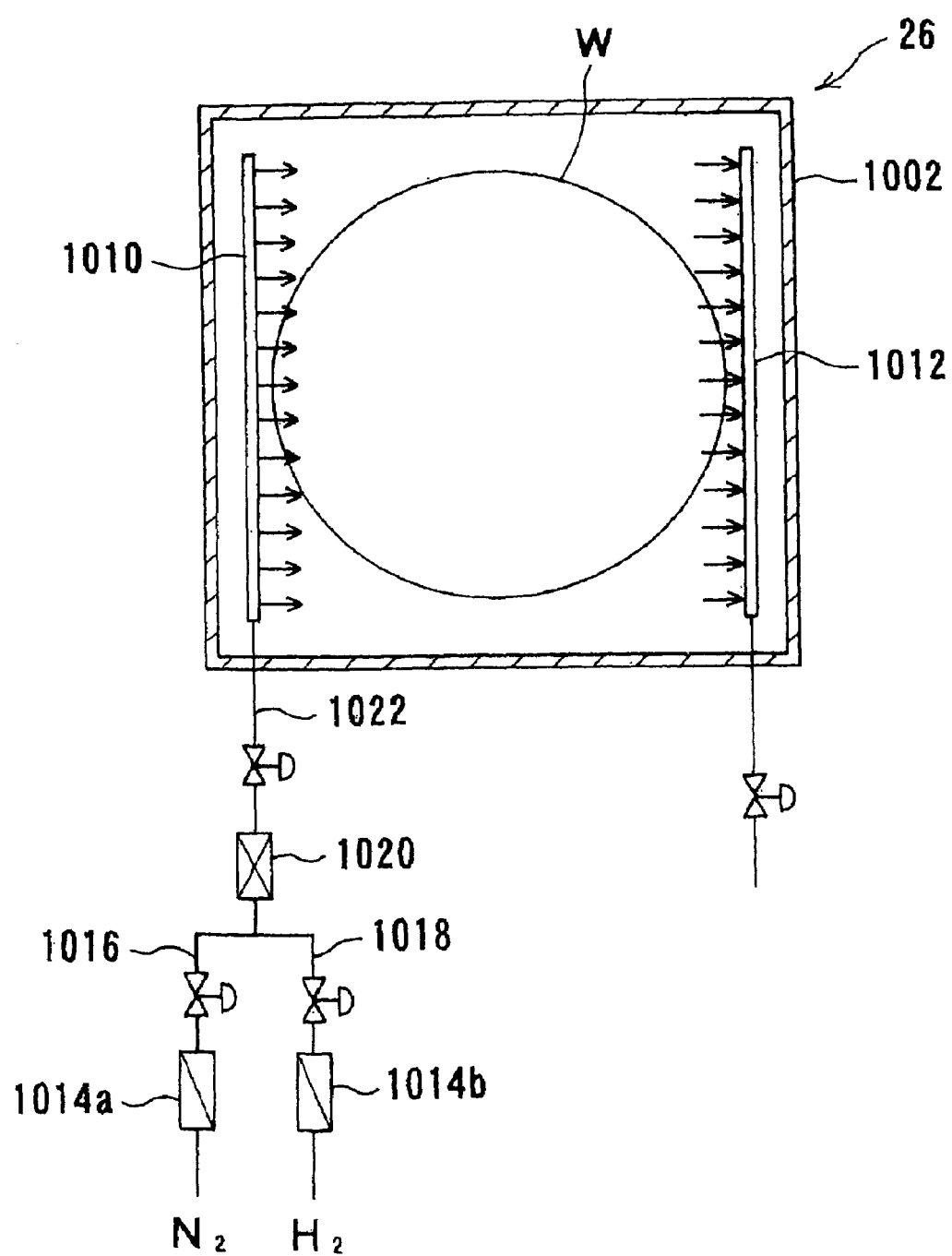
FIG. 17 is a plan cross-sectional view showing an example of the heating treatment apparatus shown in FIG. 2.

FIGS. 16 and 17 show a heat treatment (annealing) apparatus 26. The annealing apparatus 26 comprises a chamber 1002 having a gate 1000 for taking in and taking out the substrate W, a hot plate 1004 disposed at an upper position in the chamber 1002 for heating the substrate W to e.g. 400° C., and a cool plate 1006 disposed at a lower position in the chamber 1002 for cooling the substrate W by, for example, flowing cooling water inside the plate. The annealing apparatus 26 also has a plurality of vertically movable elevating pins 1008 penetrating the cool plate 1006 and extending upward and downward therethrough for placing and holding the semiconductor substrate W on them. The annealing apparatus 26 further includes a gas introduction pipe 1010 for introducing an antioxidant gas between the substrate W and the hot plate 1004 during annealing, and a gas discharge pipe 1012 for discharging the gas which has been introduced from the gas introduction pipe 1010 and flowed between the substrate W and the hot plate 1004. The pipes 1010 and 1012 are disposed on the opposite sides of the hot plate 1004.

The gas introduction pipe 1010 is connected to a mixed gas introduction line 1022 which in turn is connected to a mixer 1020 where a $N_2$ gas introduced through a $N_2$ gas introduction line 1016 containing a filter 1014a, and a $H_2$ gas introduced through a $H_2$ gas introduction line 1018 containing a filter 1014b, are mixed to form a mixed gas which flows through the line 1022 into the gas introduction pipe 1010.

In operation, the substrate W, which has been carried in the chamber 1002 through the gate 1000, is held on the elevating pins 1008 and the elevating pins 1008 are raised up to a position at which the distance between the substrate W held on the lifting pins 1008 and the hot plate 1004 becomes about 0.1 to 1.0 mm, for example. In this state, the substrate W is then heated to e.g. 400° C. through the hot plate 1004 and, at the same time, the antioxidant gas is introduced from the gas introduction pipe 1010 and the gas is allowed to flow between the substrate W and the hot plate 1004 while the gas is discharged from the gas discharge pipe 1012, thereby annealing the substrate W while preventing its oxidation. The annealing treatment may be completed in about several tens of seconds to 60 seconds. The heating temperature of the substrate may be selected in the range of 100 to 600° C.

After the completion of the annealing, the elevating pins 1008 are lowered down to a position at which the distance between the substrate W held on the elevating pins 1008 and the cool plate 1006 becomes 0 to 0.5 mm, for example. In this state, by introducing cooling water into the cool plate 1006, the substrate W is cooled by the cool plate to a temperature of 100° C. or lower in about 10 to 60 seconds. The cooled substrate is transferred to the next step.

A mixed gas of $N_2$ gas with several percentages of $H_2$ gas is used as the above antioxidant gas. However, $N_2$ gas may be used singly.

FIGS. 18 through 24 show a pretreatment apparatus 28 for performing a pretreatment of electroless plating of the substrate. The pretreatment apparatus 28 includes a fixed frame 52 that is mounted on the upper part of a frame 50, and a movable frame 54 that moves up and down relative to the fixed frame 52. A processing head 60, which includes a bottomed cylindrical housing portion 56, opening downwardly, and a substrate holder 58, is suspended from and supported by the movable frame 54. In particular, a servomotor 62 for rotating the head is mounted to the movable frame 54, and the housing portion 56 of the processing head 60 is coupled to the lower end of the downward-extending output shaft (hollow shaft) 64 of the servomotor 62.

Figure 21:
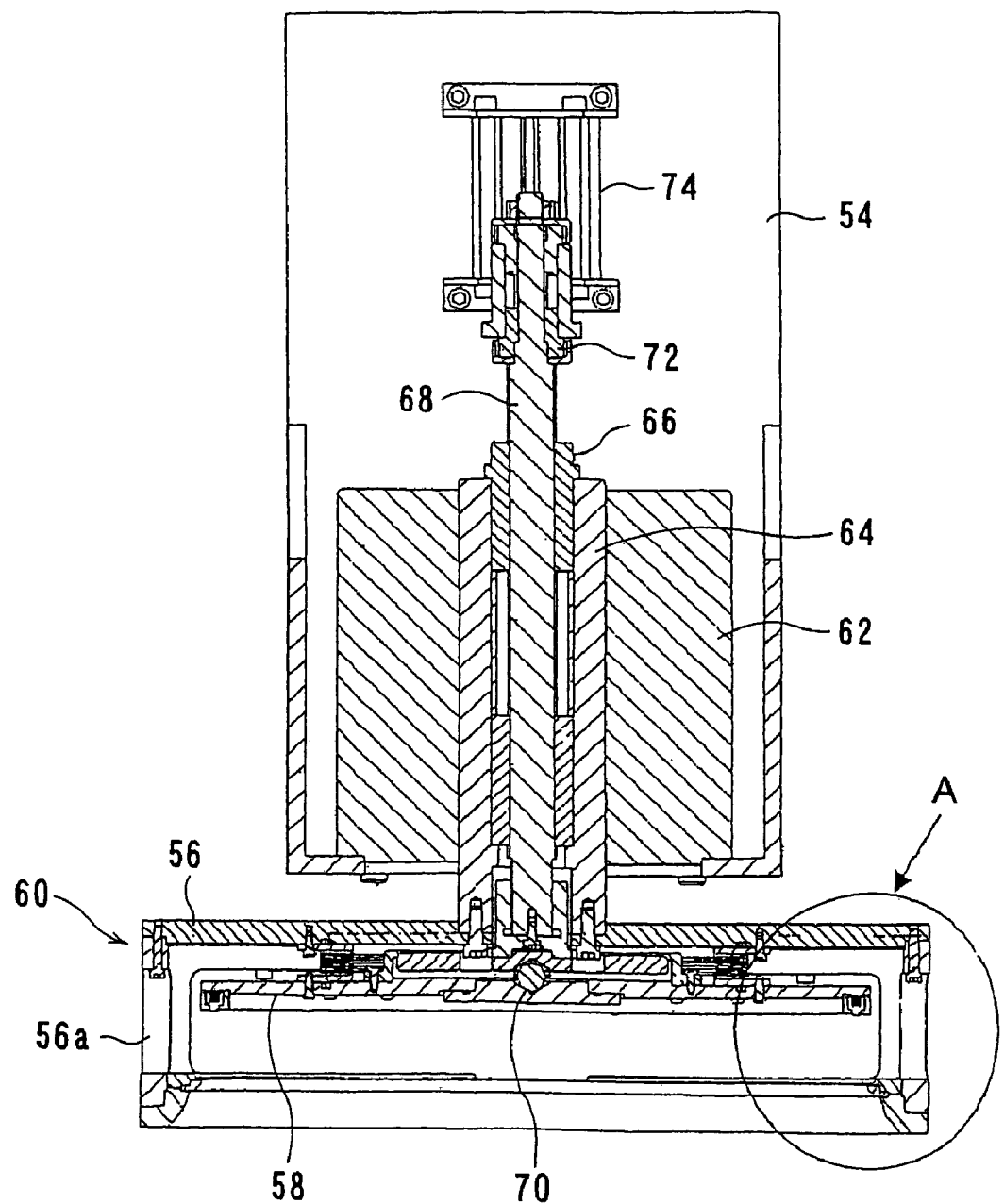
FIG. 21 is a cross-sectional view showing a processing head at the time of substrate transfer.

As shown in FIG. 21, a vertical shaft 68, which rotates together with the output shaft 64 via a spline 66, is inserted in the output shaft 64, and the substrate holder 58 of the processing head 60 is coupled to the lower end of the vertical shaft 68 via a ball joint 70. The substrate holder 58 is positioned within the housing portion 56. The upper end of the vertical shaft 68 is coupled via a bearing 72 and a bracket to a fixed ring-elevating cylinder 74 secured to the movable frame 54. Thus, by the actuation of the cylinder 74, the vertical shaft 68 moves vertically independently of the output shaft 64.

Linear guides 76, which extend vertically and guide vertical movement of the movable frame 54, are mounted to the fixed frame 52, so that by the actuation of a head-elevating cylinder (not shown), the movable frame 54 moves vertically by the guide of the linear guides 76.

Figure 22:
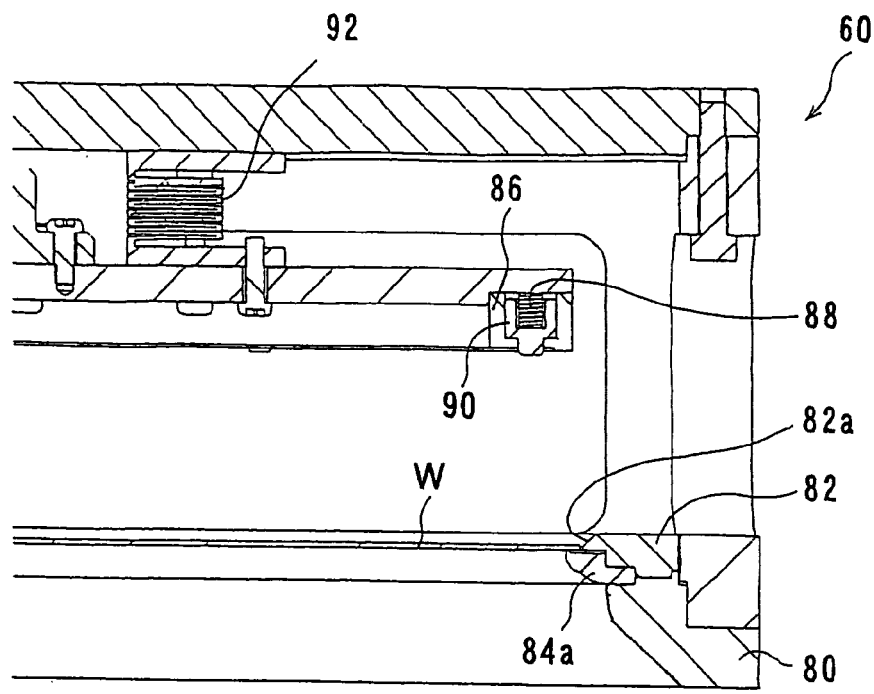
FIG. 22 is an enlarged view of A portion of FIG. 21 in the pretreatment apparatus shown in FIG. 2.
Figure 23:
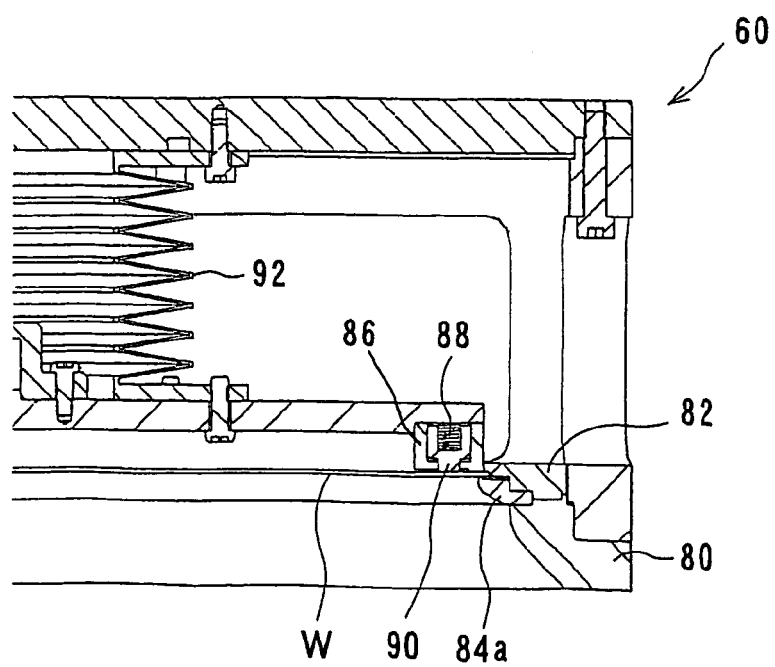
FIG. 23 is a view corresponding to FIG. 22 at the time of substrate fixing.

Substrate insertion windows 56a for inserting the substrate W into the housing portion 56 are formed in the circumferential wall of the housing portion 56 of the processing head 60. Further, as shown in FIGS. 22 and 23, a seal ring 84 is provided in the lower portion of the housing portion 56 of the processing head 60, an outer peripheral portion of the seal ring 84a being sandwiched between a main frame 80 made of e.g. PEEK and a guide frame 82 made of e.g. polyethylene. The seal ring 84a is provided to make contact with a peripheral portion of the lower surface of the substrate W to seal the peripheral portion.

On the other hand, a substrate fixing ring 86 is fixed to a peripheral portion of the lower surface of the substrate holder 58. Columnar pushers 90 each protrudes downwardly from the lower surface of the substrate fixing ring 86 by the elastic force of a spring 88 disposed within the substrate fixing ring 86 of the substrate holder 58. Further, a flexible cylindrical bellows-like plate 92 made of e.g. Teflon (registered trademark) is disposed between the upper surface of the substrate holder 58 and the upper wall of the housing portion 56 to hermetically seal the interior of the housing portion.

When the substrate holder 58 is in a raised position, a substrate W is inserted from the substrate insertion window 56a into the housing portion 56. The substrate W is then guided by a tapered surface 82a provided in the inner circumferential surface of the guide frames 82, and positioned and placed at a predetermined position on the upper surface of the seal ring 84a. In this state, the substrate holder 58 is lowered so as to bring the pushers 90 of the substrate fixing ring 86 into contact with the upper surface of the substrate W. The substrate holder 58 is further lowered so as to press the substrate W downwardly by the elastic forces of the springs 88, thereby forcing the seal ring 84a to make pressure contact with a peripheral portion of the front surface (lower surface) of the substrate W to seal the peripheral portion while nipping the substrate W between the housing portion 56 and the substrate holder 58 to hold the substrate W.

When the head-rotating servomotor 62 is driven while the substrate W is thus held by the substrate holder 58, the output shaft 64 and the vertical shaft 68 inserted in the output shaft 64 rotate together via the spline 66, whereby the substrate holder 58 rotates together with the housing portion 56.

At a position below the processing head 60, there is provided an upward-open treatment tank 100 comprising an outer tank 100a and an inner tank 100b which have a slightly larger inner diameter than the outer diameter of the processing head 60. A pair of leg portions 104, which is mounted to a lid 102, is rotatably supported on the outer circumferential portion of the treatment tank 100. Further, a crank 106 is integrally coupled to each leg portion 106, and the free end of the crank 106 is rotatably coupled to the rod 110 of a lid-moving cylinder 108. Thus, by the actuation of the lid-moving cylinder 108, the lid 102 moves between a treatment position at which the lid 102 covers the top opening of the inner tank 100b of the treatment tank 100 and a retreat position beside the treatment tank 100. In the surface (upper surface) of the lid 102, there is provided a nozzle plate 112 having a large number of jet nozzles 112 for jetting outwardly (upwardly), electrolytic ionic water having reducing power, for example.

Figure 24:
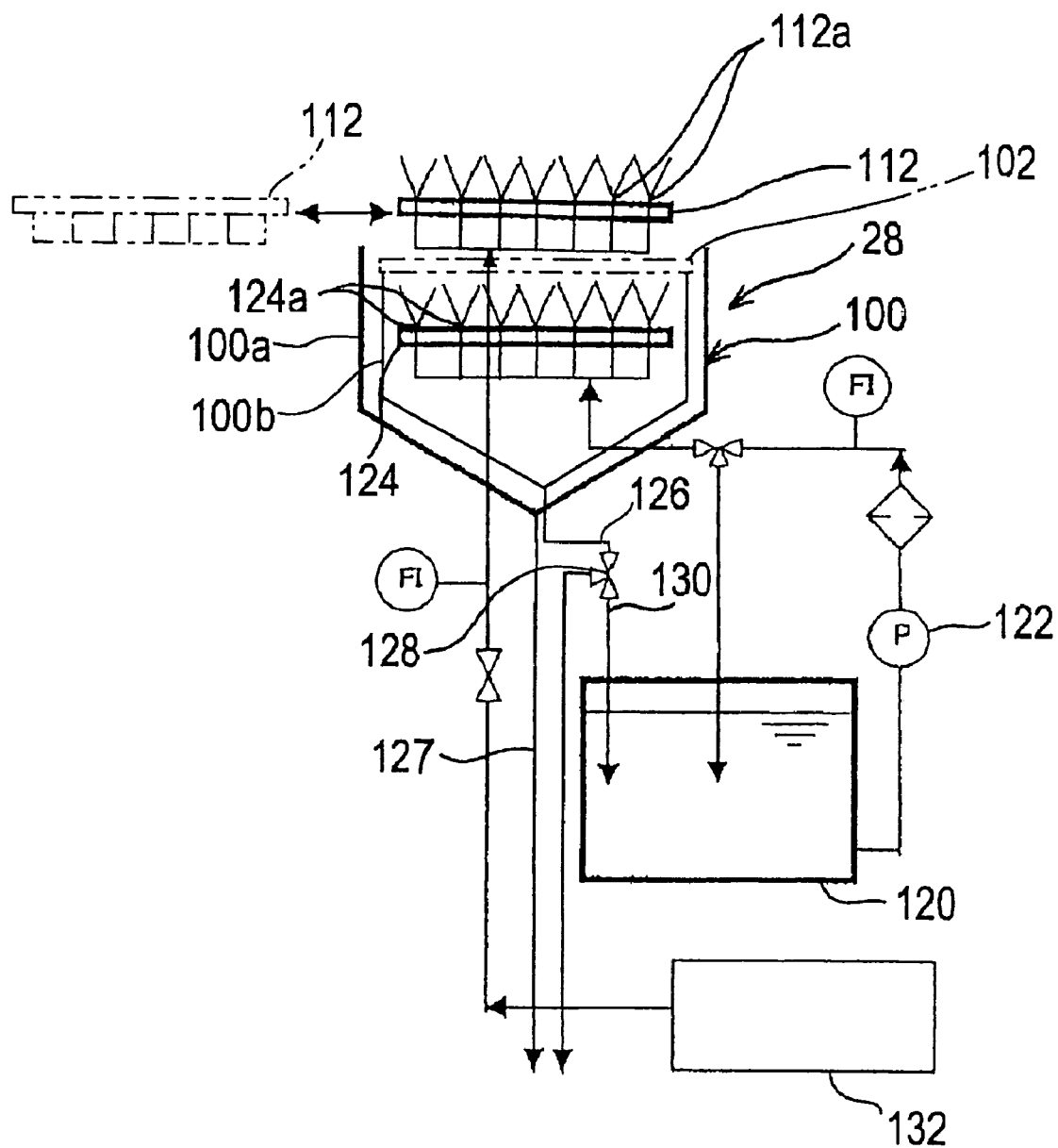
FIG. 24 is a systematic diagram of the pretreatment apparatus shown in FIG. 2.

Further, as shown in FIG. 24, a nozzle plate 124 having a plurality of jet nozzles 124a for jetting upwardly a chemical liquid supplied from a chemical liquid tank 120 by driving the chemical liquid pump 122 is provided in the inner tank 100b of the treatment tank 100 in such a manner that the jet nozzles 124a are equally distributed over the entire surface of the cross section of the inner tank 10b. A drainpipe 126 for draining a chemical liquid (waste liquid) to the outside is connected to the bottom of the inner tank 10b. A three-way valve 128 is provided in the drainpipe 126, and the chemical liquid (waste liquid) is returned to the chemical liquid tank 120 through a return pipe 130 connected to one of ports of the three-way valve 128 to recycle the chemical liquid, as needed. Further, in this embodiment, the nozzle plate 112 provided on the surface (upper surface) of the lid 102 is connected to a rinsing liquid supply source 132 for supplying a rinsing liquid such as pure water. Further, a drainpipe 127 is connected to the bottom of the outer tank 100a.

By lowering the processing head 60 holding the substrate so as to cover or close the top opening of the inner tank 100b of the treatment tank 100 with the processing head 60 and then jetting a chemical liquid from the jet nozzles 124a of the nozzle plate 124 disposed in the inner tank 100b of the treatment tank 100 toward the substrate W, the chemical liquid can be jetted uniformly onto the entire lower surface (processing surface) of the substrate W and the chemical liquid can be discharged out from the discharge pipe 126 while preventing scattering of the chemical liquid to the outside. Further, by raising the processing head 60 and closing the top opening of the inner tank 100b of the treatment tank 100 with the lid 102, and then jetting a rinsing liquid from the jet nozzles 112a of the nozzle plate 112 disposed in the upper surface of the lid 102 toward the substrate W held in the processing head 60, the rinsing treatment (cleaning treatment) is carried out to remove the chemical liquid from the surface of the substrate. Because the rinsing liquid passes through the clearance between the outer tank 100a and the inner tank 100b and is discharged through the drainpipe 127, the rinsing liquid is prevented from flowing into the inner tank 100b and from being mixed with the chemical liquid.

Figure 18:
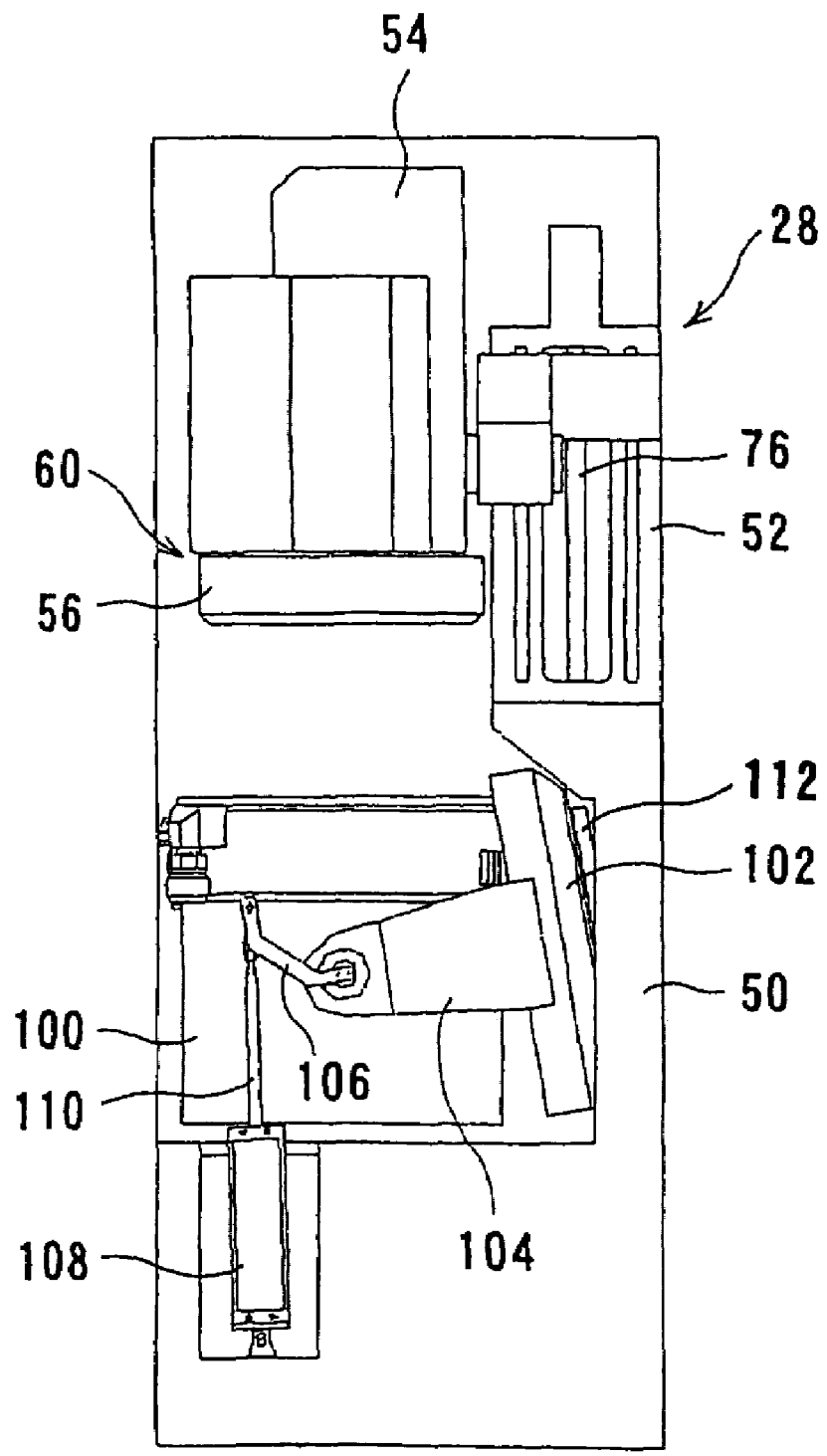
FIG. 18 is a front view of a pretreatment apparatus shown in FIG. 2 at the time of substrate transfer.
Figure 19:
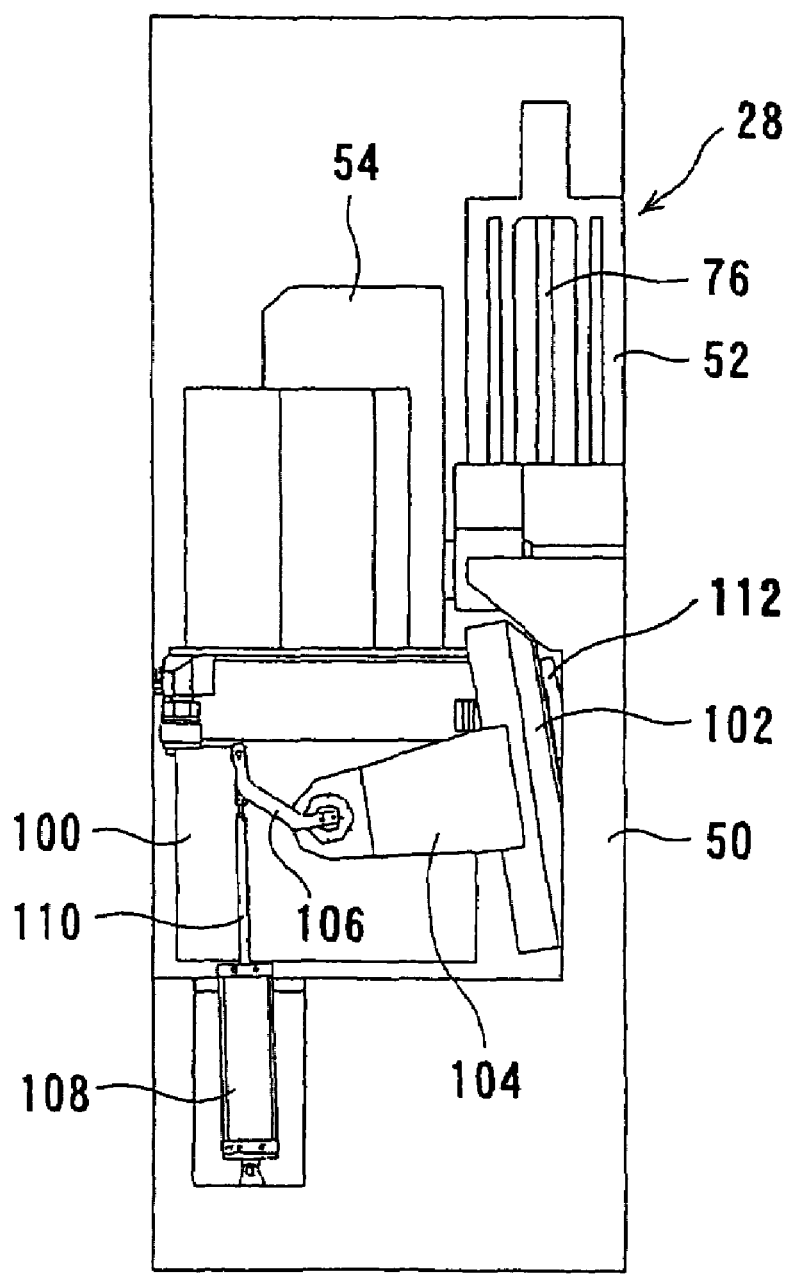
FIG. 19 is a front view of the pretreatment apparatus shown in FIG. 2 at the time of chemical treatment.
Figure 20:
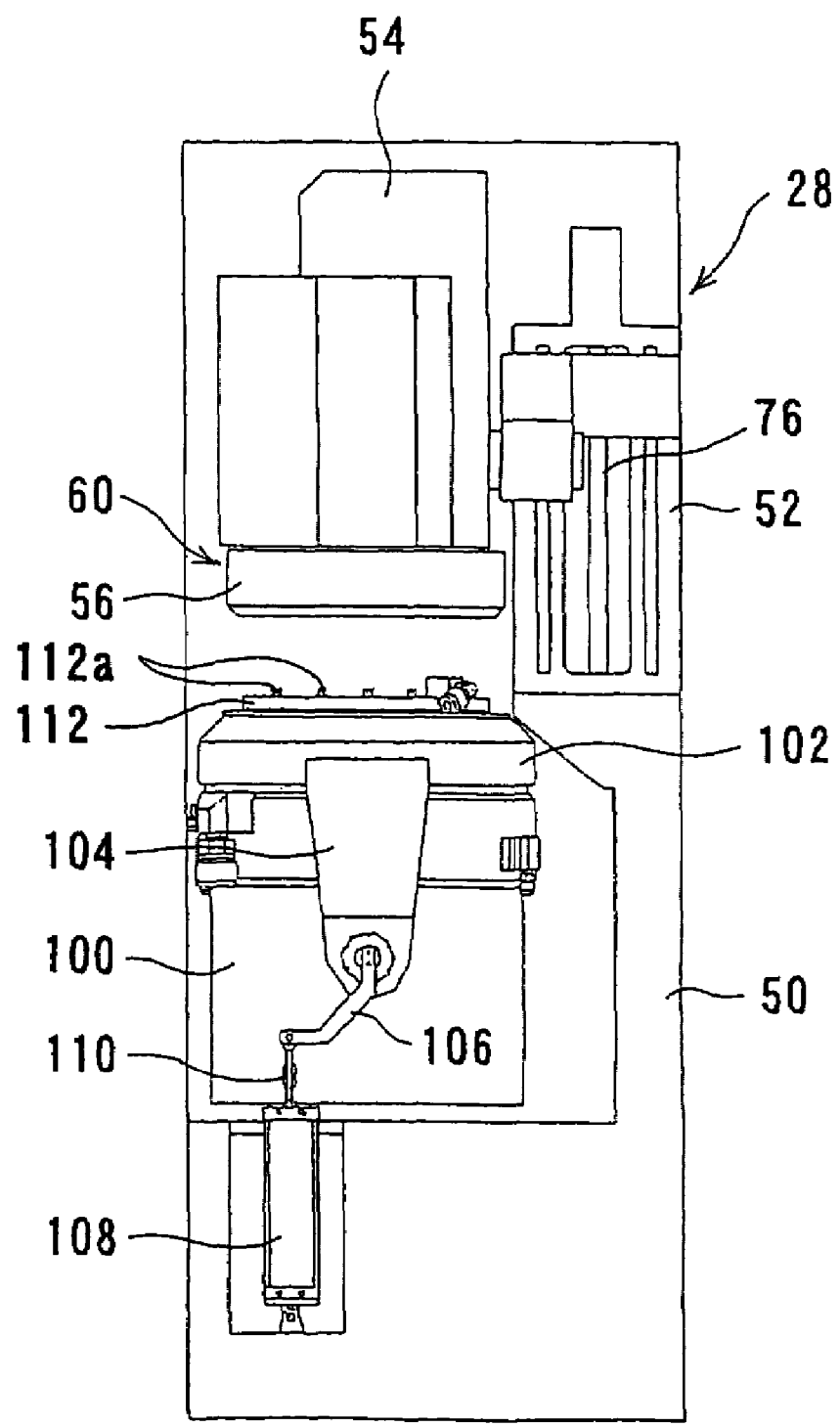
FIG. 20 is a front view of the pretreatment apparatus shown in FIG. 2 at the time of rinsing.

According to the pretreatment apparatus 28, the substrate W is inserted into the processing head 60 and held therein when the processing head 60 is in the raised position, as shown in FIG. 18. Thereafter, as shown in FIG. 19, the processing head 60 is lowered to the position at which it covers the top opening of the inner tank 100b of the treatment tank 100. While rotating the processing head 60 and thereby rotating the substrate W held in the processing head 60, a chemical liquid is jetted from the jet nozzles 124a of the nozzle plate 124 disposed in the inner tank 100b of the treatment tank 100 toward the substrate W, thereby jetting the chemical liquid uniformly onto the entire surface of the substrate W. The processing head 60 is raised and stopped at a predetermined position and, as shown in FIG. 20, the lid 102 in the retreat position is moved to the position at which it covers the top opening of the inner tank 100b of the treatment tank 100. A rinsing liquid is then jetted from the jet nozzles 112a of the nozzle plate 112 disposed in the upper surface of the lid 102 toward the rotating substrate W held in the processing head 60. The chemical treatment by the chemical liquid and the rinsing treatment by the rinsing liquid of the substrate W can thus be carried out successively while avoiding mixing of the two liquids.

The lowermost position of the processing head 60 may be adjusted to adjust the distance between the substrate W held in the processing head 60 and the nozzle plate 124, whereby the region of the substrate W onto which the chemical liquid is jetted from the jet nozzles 124a of the nozzle plate 124 and the jetting pressure can be adjusted as desired. Here, when the pretreatment liquid such as a chemical liquid is circulated and reused, active components are reduced by progress of the treatment, and the pretreatment liquid (chemical liquid) is taken out due to attachment of the treatment liquid to the substrate. Therefore, it is desirable to provide a pretreatment liquid management unit (not shown) for analyzing composition of the pretreatment liquid and adding insufficient components. Specifically, a chemical liquid used for cleaning is mainly composed of acid or alkali. Therefore, for example, a pH of the chemical liquid is measured, a decreased content is replenished from the difference between a preset value and the measured pH, and a decreased amount is replenished using a liquid level meter provided in the chemical storage tank. Further, with respect to a catalytic liquid, for example, in the case of acid palladium solution, the amount of acid is measured by its pH, and the amount of palladium is measured by a titration method or nephelometry, and a decreased amount can be replenished in the same manner as the above.

FIGS. 25 through 31 show an electroless plating apparatus 30. This electroless plating apparatus 30, which is provided to form the protective layer 9 shown in FIG. 1D, includes a plating tank 200 (see FIGS. 29 and 31) and a substrate head 204, disposed above the plating tank 200, for detachably holding a substrate W.

Figure 25:
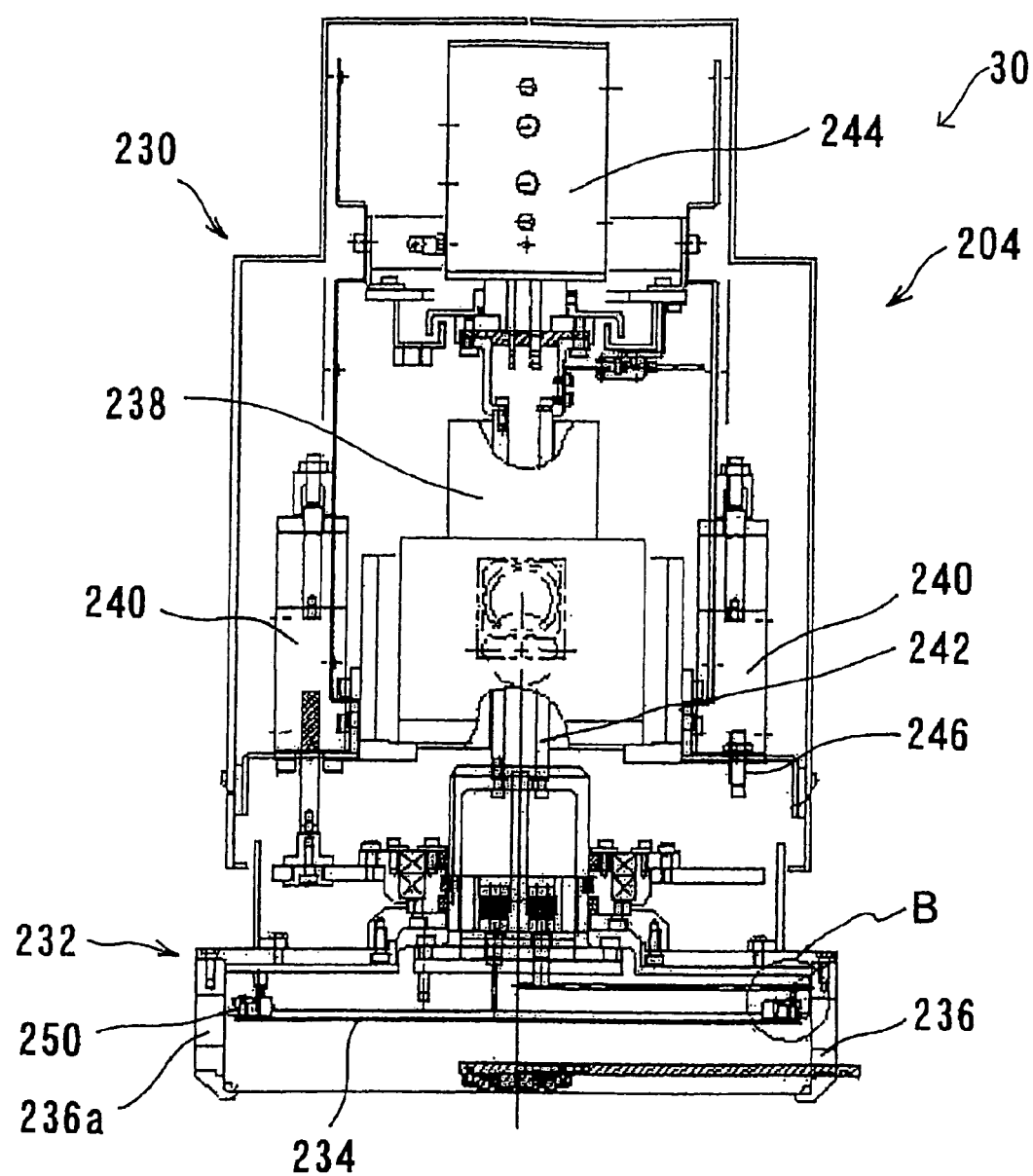
FIG. 25 is a cross-sectional view showing a substrate head at the time of substrate transfer in an electroless plating apparatus shown in FIG. 2.

As shown in detail in FIG. 25, the processing head 204 has a housing 230 and a head assembly 232. The head assembly 232 mainly comprises a suction head 234 and a substrate receiver 236 for surrounding the suction head 234. The housing 230 accommodates therein a substrate rotating motor 238 and substrate receiver drive cylinders 240. The substrate rotating motor 238 has an output shaft (hollow shaft) 242 having an upper end coupled to a rotary joint 244 and a lower end coupled to the suction head 234 of the head assembly 232. The substrate receiver drive cylinders 240 have respective rods coupled to the substrate receiver 236 of the head assembly 232. Stoppers 246 are provided in the housing 230 for mechanically limiting upward movement of the substrate receiver 236.

The suction head 234 and the substrate receiver 236 are operatively connected to each other by a splined structure such that when the substrate receiver drive cylinders 240 are actuated, the substrate receiver 236 vertically moves relative to the suction head 234, and when the substrate rotating motor 238 is energized, the output shaft 242 thereof is rotated to rotate the suction head 234 and the substrate receiver 236 in unison with each other.

Figure 26:
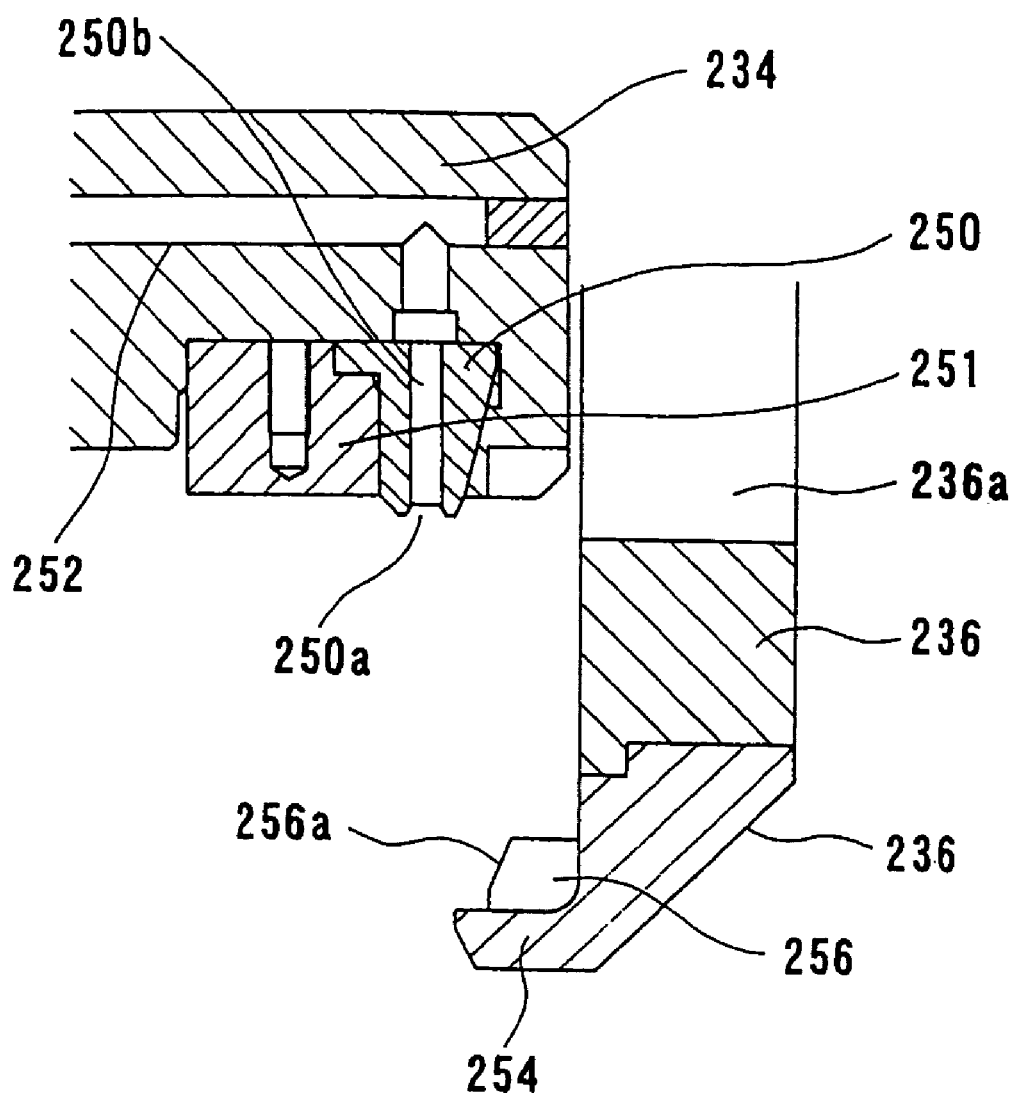
FIG. 26 is an enlarged view of B portion of FIG. 25.
Figure 27:
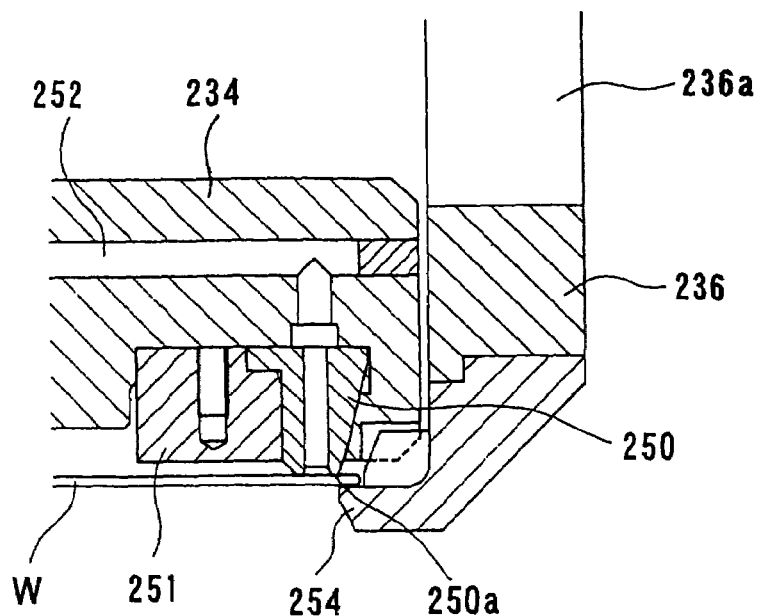
FIG. 27 is a view corresponding to FIG. 26 showing the substrate head at the time of substrate fixing.
Figure 28:
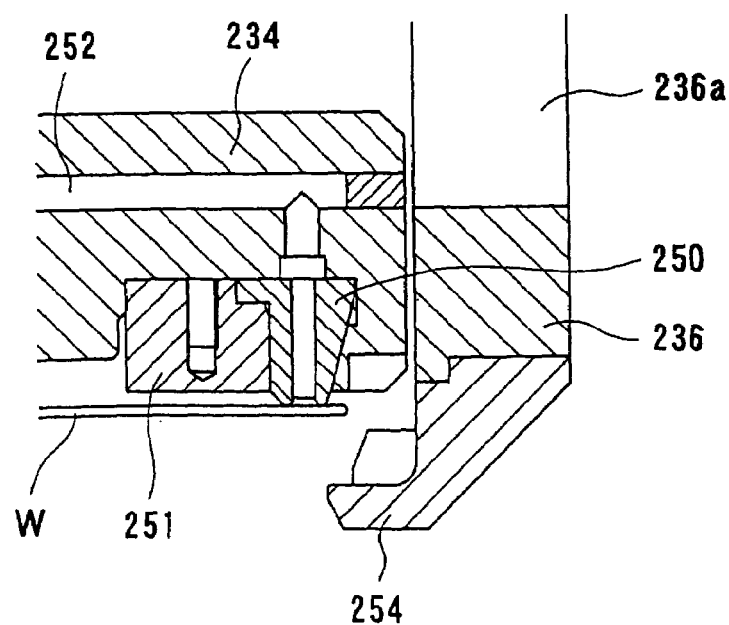
FIG. 28 is a view corresponding to FIG. 26 showing the substrate head at the time of plating process.

As shown in detail in FIGS. 26 through 28, a suction ring 250 for attracting and holding a substrate W against its lower surface to be sealed is mounted on a lower circumferential edge of the suction head 234 by a presser ring 251. The suction ring 250 has a recess 250a continuously defined in a lower surface thereof in a circumferential direction and in communication with a vacuum line 252 extending through the suction head 234 by a communication hole 250b that is defined in the suction ring 250. When the recess 250a is evacuated, the substrate W is attracted to and held by the suction ring 250. Because the substrate W is attracted under vacuum to the suction ring 250 along a radially narrow circumferential area provided by the recess 250a, any adverse effects such as flexing caused by the vacuum on the substrate W are minimized. When the suction ring 250 is dipped in the plating solution (treatment liquid), not only the surface (lower surface) of the substrate W, but also its circumferential edge, can be dipped in the plating solution. The substrate W is released from the suction ring 250 by introducing $N_2$ into the vacuum line 252.

The substrate receiver 236 is in the form of a downwardly open, hollow bottomed cylinder having substrate insertion windows 236a defined in a circumferential wall thereof for inserting therethrough the substrate W into the substrate receiver 236. The substrate receiver 236 also has an annular ledge 254 projecting inwardly from its lower end, and disk-like protrusions 256 disposed on an upper surface of the annular ledge 254 and each having a tapered inner circumferential surface 256a for guiding the substrate W.

As shown in FIG. 26, when the substrate receiver 236 is lowered, the substrate W is inserted through the substrate insertion window 236a into the substrate receiver 236. The substrate W thus inserted is guided by the tapered surfaces 256a of the protrusions 256 and positioned thereby onto the upper surface of the ledge 254 in a predetermined position thereon. The substrate receiver 236 is then elevated until it brings the upper surface of the substrate W placed on the ledge 254 into abutment against the suction ring 250 of the suction head 234, as shown in FIG. 27. Then, the recess 250a in the vacuum ring 250 is evacuated through the vacuum line 252 to attract the substrate W while sealing the upper peripheral edge surface of the substrate W against the lower surface of the suction ring 250. In order to plate the substrate W, as shown in FIG. 28, the substrate receiver 236 is lowered several mm to space the substrate W from the ledge 254, keeping the substrate W attracted only by the suction ring 250. The substrate W now has its lower peripheral edge surface prevented from not being plated because it is held out of contact with the ledge 254.

Figure 29:
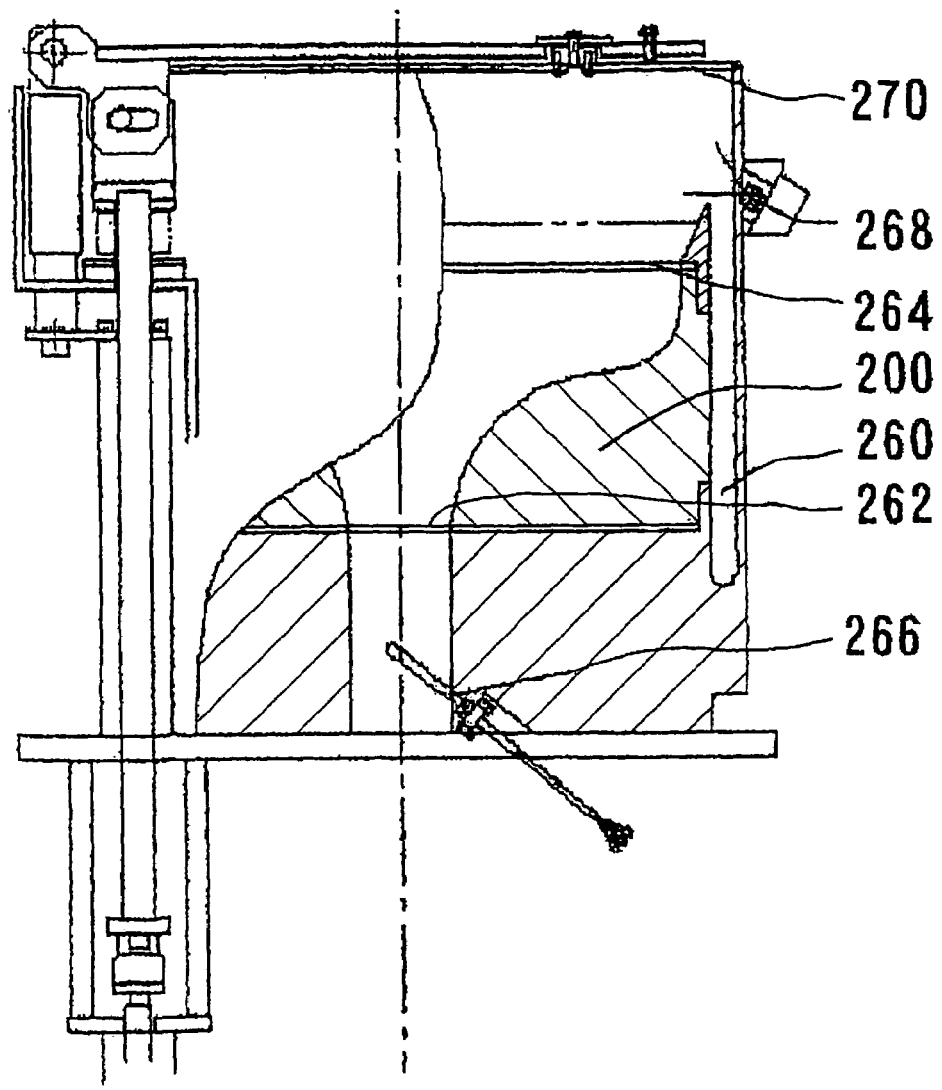
FIG. 29 is a front view with partially cross-section showing a plating tank of the electroless plating apparatus shown in FIG. 2 when a plating tank cover is closed.

FIG. 29 shows the details of the plating tank 200. The plating tank 200 is connected at the bottom to a plating solution supply pipe 308 (see FIG. 31), and is provided in the peripheral wall with a plating solution recovery groove 260. In the plating tank 200, there are disposed two current plates 262, 264 for stabilizing the flow of a plating solution flowing upward. A thermometer 266 for measuring the temperature of the plating solution introduced into the plating tank 200 is disposed at the bottom of the plating tank 200. Further, on the outer surface of the peripheral wall of the plating tank 200 and at a position slightly higher than the liquid level of the plating solution held in the plating tank 200, there is provided a jet nozzle 268 for jetting a stop liquid which is a neutral liquid having a pH of 6 to 7.5, for example, pure water, inwardly and slightly upwardly in the normal direction. After plating, the substrate W held in the head portion 232 is raised and stopped at a position slightly above the surface of the plating solution. In this state, pure water (stop liquid) is immediately jetted from the jet nozzle 268 toward the substrate W to cool the substrate W, thereby preventing progress of plating by the plating solution remaining on the substrate W.

Further, at the top opening of the plating tank 200, there is provided a plating tank cover 270 which closes the top opening of the plating tank 200 in a non-plating time, such as idling time, so as to prevent unnecessary evaporation of the plating solution from the plating tank 200.

Figure 31:
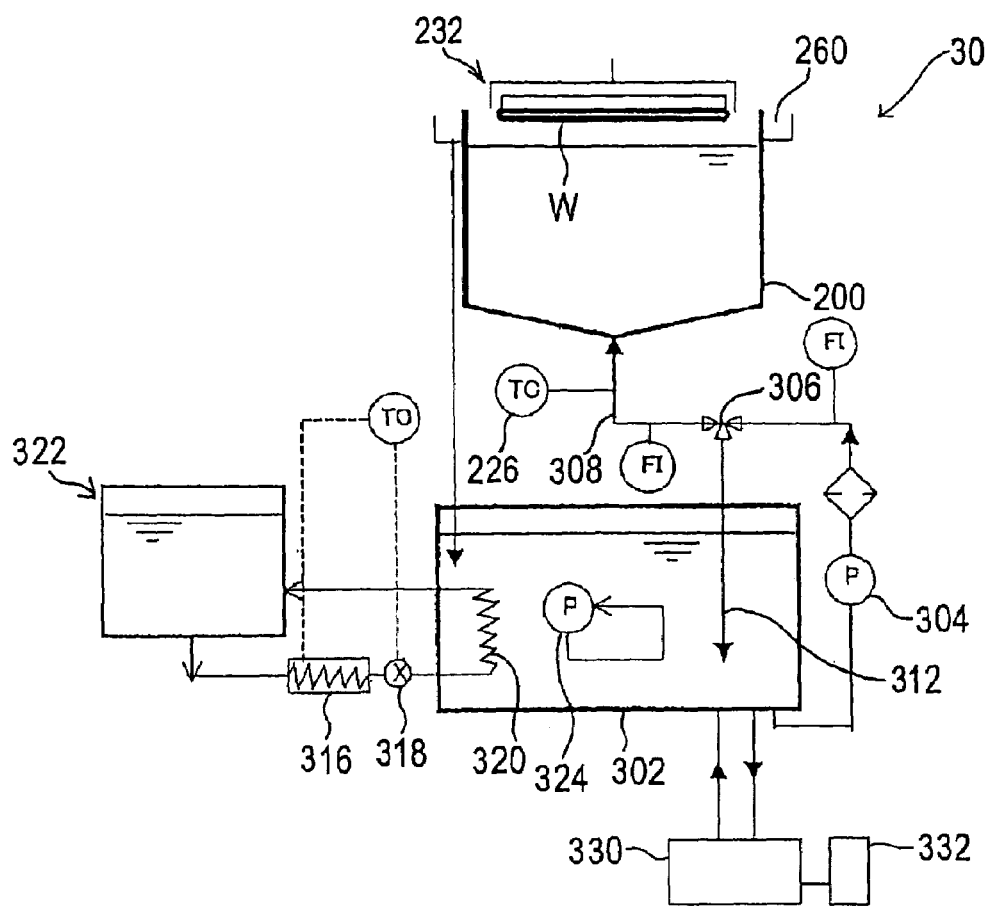
FIG. 31 is a systematic diagram of the electroless plating apparatus shown in FIG. 2.

As shown in FIG. 31, a plating solution supply pipe 308 extending from a plating solution storage tank 302 and having a plating solution supply pump 304 and a three-way valve 306 is connected to the plating tank 200 at the bottom of the plating tank 200. With this arrangement, during a plating process, a plating solution is supplied into the plating tank 200 from the bottom of the plating tank 200, and the overflowing plating solution is recovered by the plating solution storage tank 302 through the plating solution recovery groove 260. Thus, the plating solution can be circulated. A plating solution return pipe 312 for returning the plating solution to the plating solution storage tank 302 is connected to one of the ports of the three-way valve 306. Thus, the plating solution can be circulated even in a standby condition of plating, and a plating solution circulating system is constructed. As described above, the plating solution in the plating solution storage tank 302 is always circulated through the plating solution circulating system, and hence a lowering rate of the concentration of the plating solution can be reduced and the number of the substrates W which can be processed can be increased, compared with the case in which the plating solution is simply stored.

Particularly, in this embodiment, by controlling the plating solution supply pump 304, the flow rate of the plating solution which is circulated at a standby of plating or at a plating process can be set individually. Specifically, the amount of circulating plating solution at the standby of plating is in the range of 2 to 20 litter/minute, for example, and the amount of circulating plating solution at the plating process is in the range of 0 to 10 litter/minute, for example. With this arrangement, a large amount of circulating plating solution at the standby of plating can be ensured to keep a temperature of the plating bath in the cell constant, and the flow rate of the circulating plating solution is made smaller at the plating process to form a protective film (plated film) having a more uniform thickness.

The thermometer 266 provided in the vicinity of the bottom of the plating tank 200 measures a temperature of the plating solution introduced into the plating tank 200, and controls a heater 316 and a flow meter 318 described below.

Specifically, in this embodiment, there are provided a heating device 322 for heating the plating solution indirectly by a heat exchanger 320 which is provided in the plating solution in the plating solution storage tank 302 and uses water as a heating medium which has been heated by a separate heater 316 and has passed through the flow meter 318, and a stirring pump 324 for mixing the plating solution by circulating the plating solution in the plating solution storage tank 302. This is because in the electroless plating, in some cases, the plating solution is used at a high temperature (about 80° C.), and the structure should cope with such cases. This method can prevent very delicate plating solution from being mixed with foreign matter or the like unlike an in-line heating method.

Figure 30:
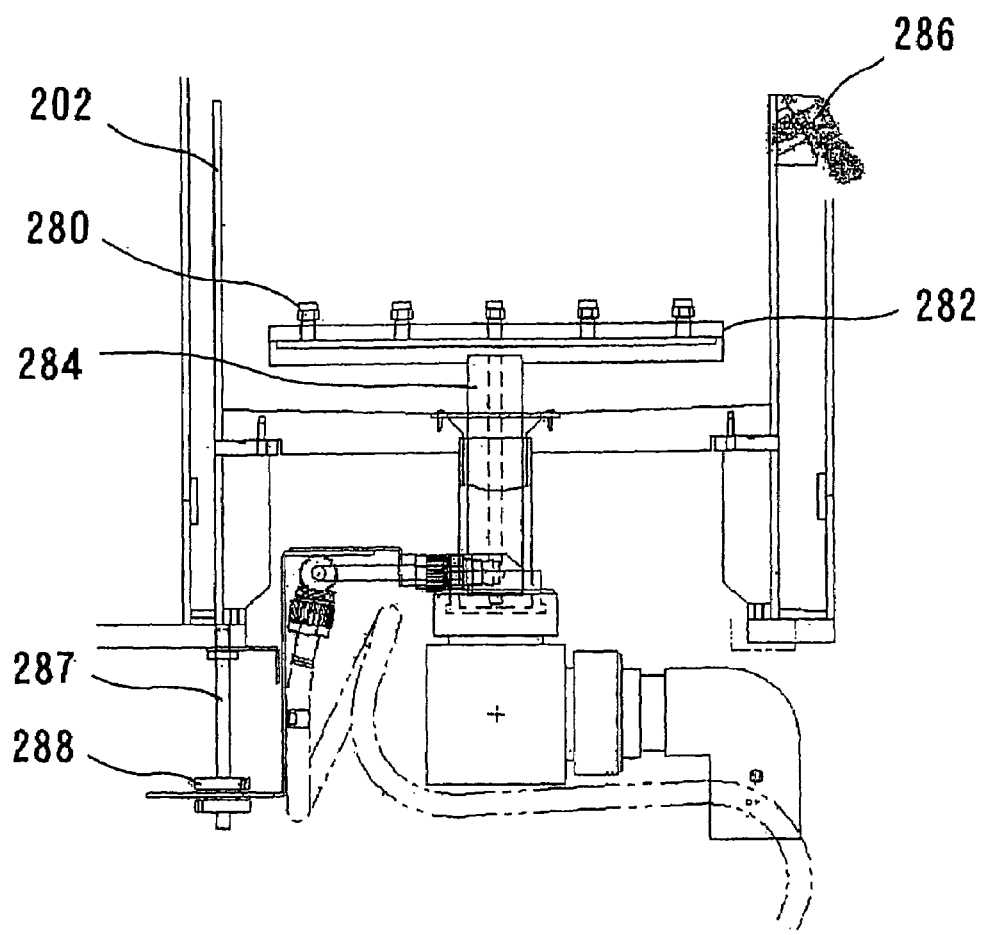
FIG. 30 is a cross-sectional view of a cleaning tank in the electroless plating apparatus shown in FIG. 2.

FIG. 30 shows the details of a cleaning tank 202 provided beside the plating tank 200. At the bottom of the cleaning tank 202, there is provided a nozzle plate 282 having a plurality of jet nozzles 280, attached thereto, for upwardly jetting a rinsing liquid such as pure water. The nozzle plate 282 is coupled to an upper end of a nozzle lifting shaft 284. The nozzle lifting shaft 284 can be moved vertically by changing the position of engagement between a nozzle position adjustment screw 287 and a nut 288 engaging the screw 287 so as to optimize the distance between the jet nozzles 280 and a substrate W located above the jet nozzles 280.

Further, on the outer surface of the peripheral wall of the cleaning tank 202 and at a position above the jet nozzles 280, there is provided a head cleaning nozzle 286 for jetting a cleaning liquid, such as pure water, inwardly and slightly downwardly onto at least a portion, which was in contact with the plating solution, of the head portion 232 of the substrate head 204.

In operating the cleaning tank 202, the substrate W held in the head portion 232 of the substrate head 204 is located at a predetermined position in the cleaning tank 202. A cleaning liquid (rinsing liquid), such as pure water, is jetted from the jet nozzles 280 to clean (rinse) the substrate W, and at the same time, a cleaning liquid such as pure water is jetted from the head cleaning nozzle 286 to clean at least a portion, which was in contact with the plating solution, of the head portion 232 of the substrate head 204, thereby preventing a deposit from accumulating on that portion which was immersed in the plating solution.

According to this electroless plating apparatus 30, when the substrate head 204 is in a raised position, the substrate W is held by vacuum attraction in the head portion 232 of the substrate head 204 as described above, while the plating solution in the plating tank 200 is allowed to circulate.

When plating is performed, the plating tank cover 270 is opened, and the substrate head 204 is lowered, while the substrate head 204 is rotating, so that the substrate W held in the head portion 232 is immersed in the plating solution in the plating tank 200.

After immersing the substrate W in the plating solution for a predetermined time, the substrate head 204 is raised to lift the substrate W from the plating solution in the plating tank 200 and, as needed, pure water (stop liquid) is immediately jetted from the jet nozzle 268 toward the substrate W to cool the substrate W, as described above. The substrate head 204 is further raised to lift the substrate W to a position above the plating tank 200, and the rotation of the substrate head 204 is stopped.

Next, while the substrate W is held by vacuum attraction in the head portion 232 of the substrate head 204, the substrate head 204 is moved to a position right above the cleaning tank 202. While rotating the substrate head 204, the substrate head 204 is lowered to a predetermined position in the cleaning tank 202. A cleaning liquid (rinsing liquid), such as pure water, is jetted from the jet nozzles 280 to clean (rinse) the substrate W, and at the same time, a cleaning liquid such as pure water is jetted from the head cleaning nozzle 286 to clean at least a portion, which was in contact with the plating solution, of the head portion 232 of the substrate head 204.

After completion of cleaning of the substrate W, the rotation of the substrate head 204 is stopped, and the substrate head 204 is raised to lift the substrate W to a position above the cleaning tank 202. Further, the substrate head 204 is moved to the transfer position between the transfer robot 16 and the substrate head 204, and the substrate W is transferred to the transfer robot 16, and is transferred to a next process by the transfer robot 16.

As shown in FIG. 31, the electroless plating apparatus 30 is provided with a plating solution management unit 330 for measuring an amount of the plating solution held by the electroless plating apparatus 30 and for analyzing composition of the plating solution by an absorptiometric method, a titration method, an electrochemical measurement, or the like, and replenishing components which are insufficient in the plating solution. In the plating solution management unit 330, signals indicative of the analysis results are processed to replenish insufficient components from a replenishment tank (not shown) to the plating solution storage tank 302 using a metering pump, thereby controlling the amount of the plating solution and composition of the plating solution. Thus, thin film plating can be realized with a good reproducibility.

The plating solution management unit 330 has a dissolved oxygen densitometer 332 for measuring dissolved oxygen in the plating solution held by the electroless plating apparatus 30 by an electrochemical method, for example. According to the plating solution management unit 330, dissolved oxygen concentration in the plating solution can be controlled at a constant value on the basis of an indication of the dissolved oxygen densitometer 332 by deaeration, nitrogen blowing, or other methods. In this manner, the dissolved oxygen concentration in the plating solution can be controlled at a constant value, and the plating reaction can be achieved with a good reproducibility.

When the plating solution is used repeatedly, certain components are accumulated by being carried in from the outside or decomposition of the plating solution, resulting in lowering of reproducibility of plating and deteriorating of film quality. By adding a mechanism for removing such specific components selectively, the life of the plating solution can be prolonged and the reproducibility can be improved.

Figure 32:
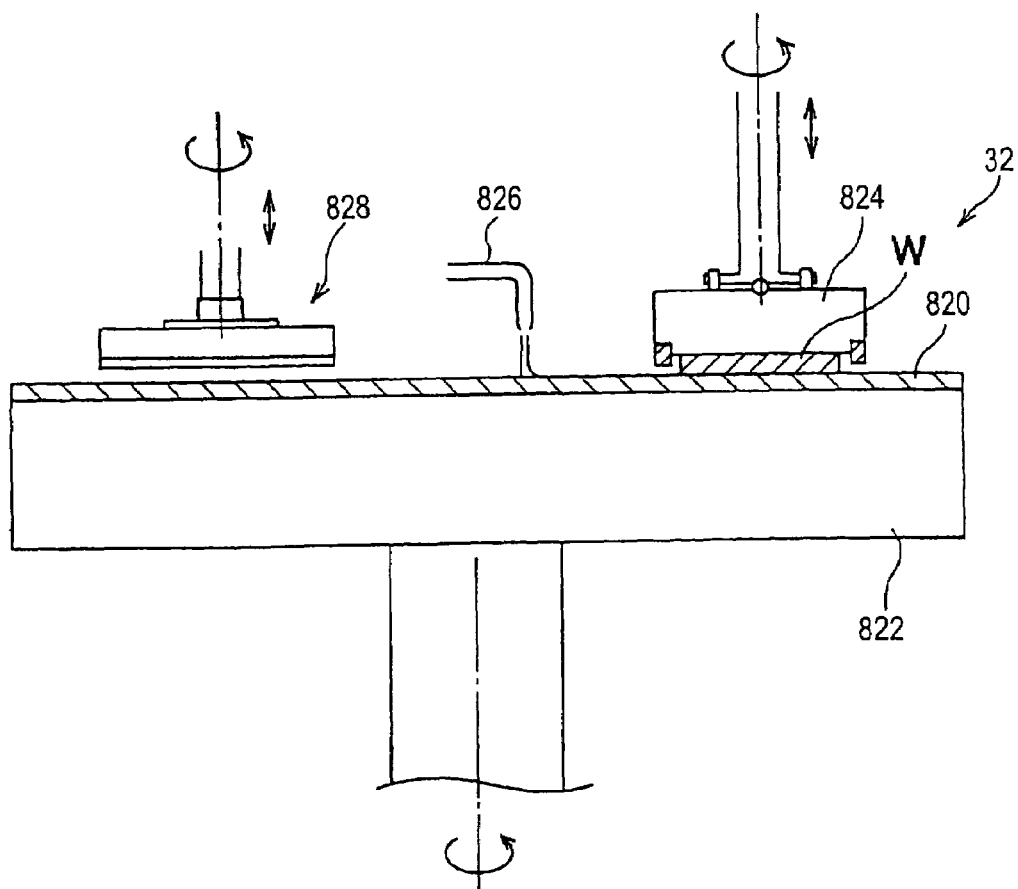
FIG. 32 is a schematic view showing an example of a polishing apparatus shown in FIG. 2.

FIG. 32 shows an example of a polishing apparatus (CMP apparatus) 32. The polishing apparatus 32 comprises a polishing table 822 having a polishing surface composed of a polishing cloth (polishing pad) 820 which is attached to the upper surface of the polishing table 822, and a top ring 824 for holding a substrate W with its to-be-polished surface facing the polishing table 822. In the polishing apparatus 32, the surface of the substrate W is polished by rotating the polishing table 822 and the top ring 824 about their own axes, respectively, and supplying a polishing liquid from a polishing liquid nozzle 826 provided above the polishing table 822 while pressing the substrate W against the polishing cloth 820 of the polishing table 822 at a given pressure by means of the top ring 824. It is possible to use a fixed abrasive type of pad containing fixed abrasive particles as the polishing pad.

The polishing power of the polishing surface of the polishing cloth 820 decreases with a continuation of a polishing operation of the CMP apparatus 32. In order to restore the polishing power, a dresser 828 is provided to conduct dressing of the polishing cloth 820, for example, at the time of replacing the substrate W. In the dressing, while rotating the dresser 328 and the polishing table 822 respectively, the dressing surface (dressing member) of the dresser 828 is pressed against the polishing cloth 820 of the polishing table 822, thereby removing the polishing liquid and chips adhering to the polishing surface and, at the same time, flattening and dressing the polishing surface, whereby the polishing surface is regenerated. The polishing table 822 may be provided with a monitor for monitoring the surface state of the substrate to detect in situ the end point of polishing, or with a monitor for inspecting in situ the finish state of the substrate.

Figure 33:
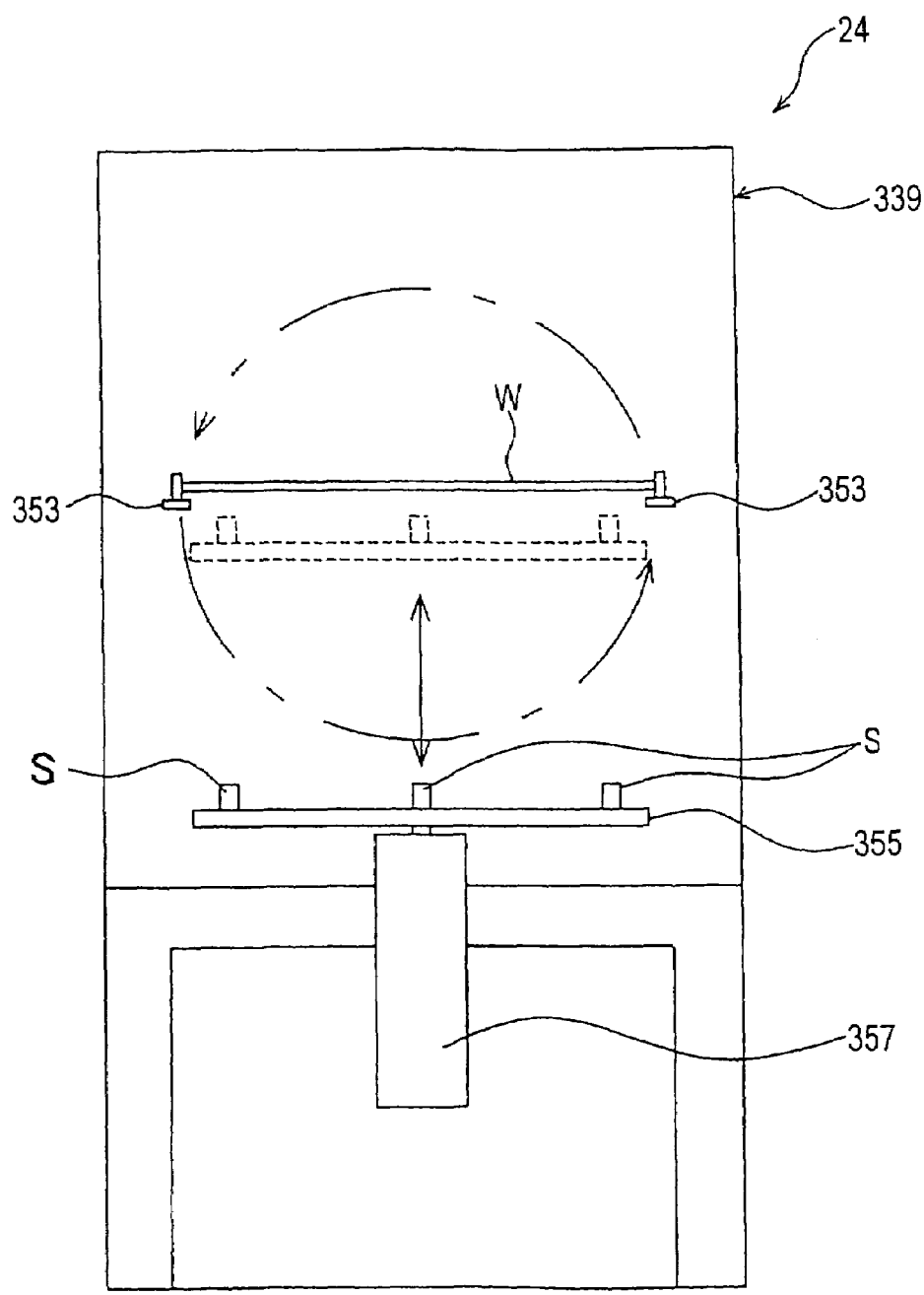
FIG. 33 is a schematic front view of neighborhood of a reversing machine in a film thickness measuring instrument shown in FIG. 2.
Figure 34:
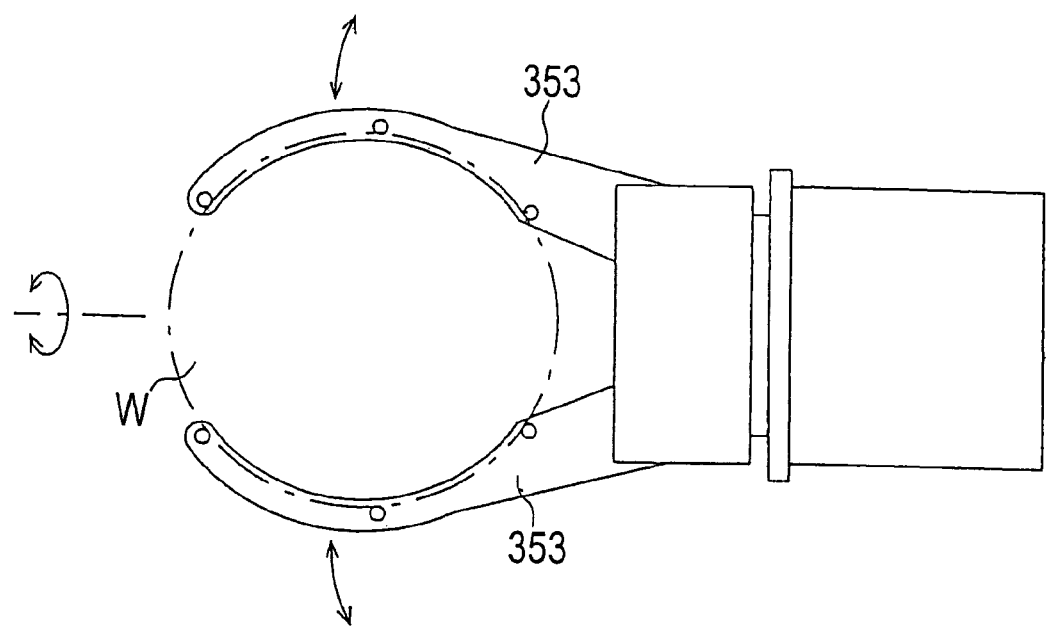
FIG. 34 is a plan view of a reversing arm section.

FIGS. 33 and 34 show the film thickness measuring instrument 24 provided with a reversing machine. As shown in the FIGS. 33 and 34, the film thickness measuring instrument 24 is provided with a reversing machine 339. The reversing machine 339 includes reversing arms 353, 353. The reversing arms 353, 353 put a substrate W therebetween and hold its outer periphery from right and left sides, and rotate the substrate W through 1800, thereby turning the substrate over. A circular mounting base 355 is disposed immediately below the reversing arms 353, 353 (reversing stage), and a plurality of film thickness sensors S are provided on the mounting base 355. The mounting base 355 is adapted to be movable vertically by a drive mechanism 357.

During reversing of the substrate W, the mounting base 355 waits at a position, indicated by solid lines, below the substrate W. Before or after reversing, the mounting base 355 is raised to a position indicated by dotted lines to bring the film thickness sensors S close to the substrate W gripped by the reversing arms 353, 353, thereby measuring a film thickness.

According to this embodiment, since there is no restriction such as the arms of the transfer robot, the film thickness sensors S can be installed at arbitrary positions on the mounting base 355. Further, the mounting base 355 is adapted to be movable vertically, so that the distance between the substrate W and the sensors S can be adjusted at the time of measurement. It is also possible to mount plural types of sensors suitable for the purpose of detection, and change the distance between the substrate W and the sensors each time measurements are made by the respective sensors. However, the mounting base 355 moves vertically, thus requiring certain measuring time.

An eddy current sensor, for example, may be used as the film thickness sensor S. The eddy current sensor measures a film thickness by generating an eddy current and detecting the frequency or loss of the current that has returned through the substrate W, and is used in a non-contact manner. An optical sensor may also be suitable for the film thickness sensor S. The optical sensor irradiates a light onto a sample, and measures a film thickness directly based on information of the reflected light. The optical sensor can measure a film thickness not only for a metal film but also for an insulating film such as an oxide film. Places for setting the film thickness sensor S are not limited to those shown in the drawings, but the sensor may be set at any desired place for measurement in any desired quantity.

Figure 35:
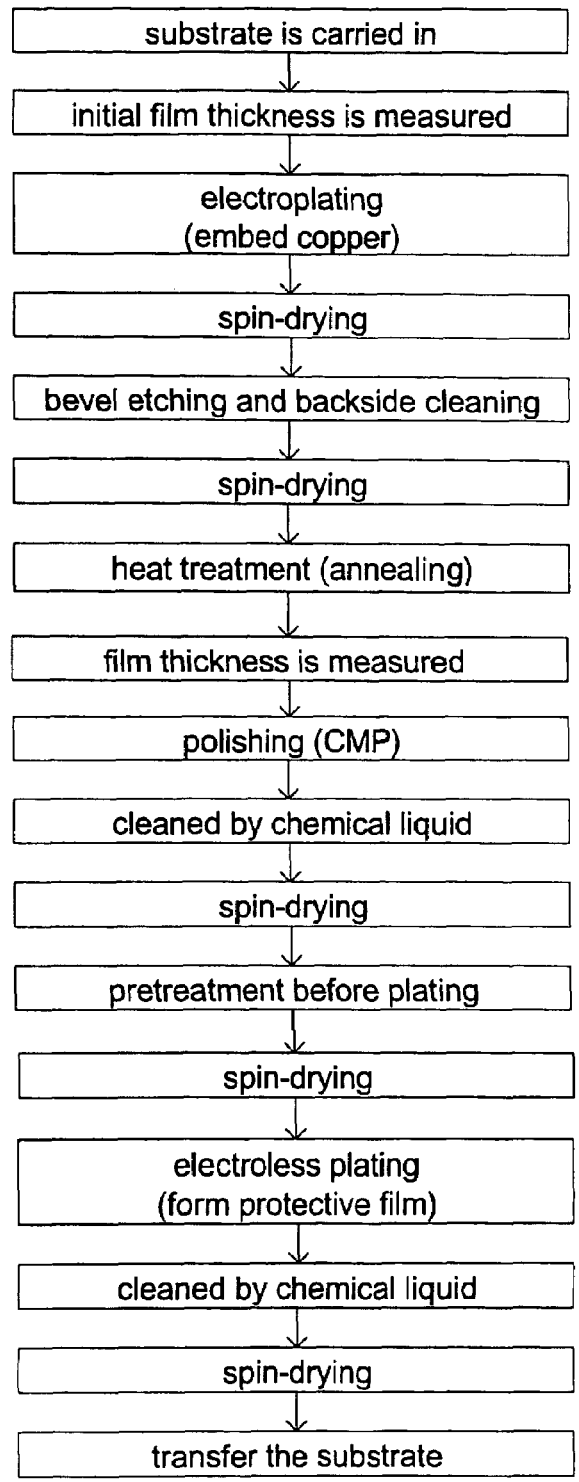
FIG. 35 is a flow chart in a substrate processing apparatus shown in FIG. 2.

Next, a sequence of processing for forming copper interconnects on the substrate having the seed layer 6 formed thereon, as shown in FIG. 1B, which is carried out by the substrate processing apparatus having the above structure will be described with reference to FIG. 35.

First, the substrate W having the seed layer 6 formed in its surface is taken out one by one from a transfer box 10, and is carried in the loading/unloading station 14. The substrate W which has carried in the loading/unloading station 14 is transferred to the thickness measuring instrument 24 by the transfer robot 16, and an initial film thickness (film thickness of the seed layer 6) is measured by the thickness measuring instrument 24. Thereafter, if necessary, the substrate is inverted and transferred to the plating apparatus 18. In the plating apparatus 18, as shown in FIG. 1B, the copper layer 7 is deposited on the surface of the substrate W to embed copper.

Then, the substrate W having the copper layer 7 formed thereon is transferred to the cleaning and drying apparatus 20 by the transfer robot 16, and the substrate W is cleaned by pure water and spin-dried. Alternatively, in a case where a spin-drying function is provided in the plating apparatus 18, the substrate W is spin-dried (removal of liquid) in the plating apparatus 18, and then the dried substrate is transferred to the bevel etching and backside cleaning apparatus 22.

In the bevel etching and backside cleaning apparatus 22, unnecessary copper attached to the bevel (edge) of the substrate W is removed by etching, and at the same time, the backside surface of the substrate is cleaned by pure water or the like. Thereafter, as described above, the substrate W is transferred to the cleaning and drying apparatus 20 by the transfer robot 16, and the substrate W is cleaned by pure water and spin-dried. Alternatively, in a case where a spin-drying function is provided in the bevel etching and backside cleaning apparatus 22, the substrate W is spin-dried in the bevel etching and backside cleaning apparatus 22, and then the dried substrate is transferred to the heat treatment apparatus 26 by the transfer robot 16.

In the heat treatment apparatus 26, heat treatment (annealing) of the substrate W is carried out. Then, the substrate W after the heat treatment is transferred to the film thickness measuring instrument 24 by the transfer robot 16, and a film thickness of copper is measured by the film thickness measuring instrument 24. The film thickness of the copper layer 7 (see FIG. 1B) is obtained from the difference between this measured result and the measured result of the above initial film thickness. Then, for example, plating time of a subsequent substrate is adjusted according to the measured film thickness. If the film thickness of the copper layer 7 is insufficient, then additional formation of the copper layer is performed by plating again. Then, the substrate W after the film thickness measurement is transferred to the polishing apparatus 32 by the transfer robot 16.

As shown in FIG. 1C, unnecessary copper layer 7 and the seed layer 6 deposited on the surface of the substrate W are polished and removed by the polishing apparatus 32 to planarize the surface of the substrate W. At this time, for example, the film thickness and the finishing state of the substrate are inspected by a monitor, and when an end point is detected by the monitor, polishing is finished. Then, the substrate W which has been polished is transferred to the cleaning and drying apparatus 20 by the transfer robot 16, and the surface of the substrate is cleaned by a chemical liquid and then cleaned (rinsed) with pure water, and then spin-dried by rotating the substrate at a high speed in the cleaning and drying apparatus 20. After this spin-drying, the substrate W is transferred to the pretreatment apparatus 28 by the transfer robot 16.

In the pretreatment apparatus 28, a pretreatment before plating comprising at least one of attachment of Pd catalyst to the surface of the substrate and removal of oxide film attached to the exposed surface of the substrate, for example, is carried out. Then, the substrate after this pretreatment, as described above, is transferred to the cleaning and drying apparatus 20 by the transfer robot 16, and the substrate W is cleaned by pure water and spin-dried. Alternatively, in a case where a spin-drying function is provided in the pretreatment apparatus 28, the substrate W is spin-dried (removal of liquid) in the pretreatment apparatus 28, and then the dried substrate is transferred to the electroless plating apparatus 30 by the transfer robot 16.

In the electroless plating apparatus 30, as shown in FIG. 1D, for example, electroless COWP plating is applied to the surface of the exposed interconnects 8 to form a protective film (plated film) 9 composed of COWP alloy selectively on the exposed surfaces of the interconnects 8, thereby protecting the interconnects 8. The film thickness of the protective film 9 is in the range of 0.1 to 500 nm, preferably in the range of 1 to 200 nm, more preferably in the range of 10 to 100 nm. At this time, for example, the thickness of the protective film 9 is monitored, and when the film thickness reaches a predetermined value, i.e., an end point is detected, the electroless plating is finished.

After the electroless plating, the substrate W is transferred to the cleaning and drying apparatus 20 by the transfer robot 16, and the surface of the substrate is cleaned by a chemical liquid, and cleaned (rinsed) with pure water, and then spin-dried by rotating the substrate at a high speed in the cleaning and drying apparatus 20. After the spin-drying, the substrate W is returned into the transfer box 10 via the loading/unloading station 14 by the transfer robot 16.

In the above embodiments, copper is used as an interconnect material. However, besides copper, a copper alloy, silver, a silver alloy, and the like may be used.

According to the present invention, irregularities of contact between the porous member and the surface to be plated, which would occur due to surface undulations and warpage of the plating solution impregnated material which is disposed on the back side of the porous member for pressing the porous member against the surface to be plated, are reduced, and the entire surface of the porous member is brought into contact with the surface to be plated of the substrate under uniform pressure for plating the substrate without the need for increasing the pressing load. In this manner, the flatness of the surface of the substrate which is plated is increased.

Although certain preferred embodiments of the present invention have been shown and described in detail, it should be understood that various changes and modifications may be made therein without departing from the scope of the appended claims.

What is claimed is:

1. A plating apparatus for a substrate, comprising:
a substrate holder for holding a substrate;
a cathode unit having a seal member for abutting against and sealing, in a water-tight manner, a peripheral portion of a surface, to be plated, of the substrate held by said substrate holder, and a cathode electrode which is brought into contact with the substrate to supply current to the substrate;
an anode vertically moveable disposed in confronting relation to the surface, to be plated, of the substrate;
a plating solution impregnated material disposed between said anode and the surface, to be plated, of the substrate, said plating solution impregnated material being made of a water-retentive material and being constructed of a plurality of separate members; and
a porous member disposed between said plating solution impregnated material and the surface, to be plated, of the substrate; and
a plurality of pressing mechanisms, each of said pressing mechanisms being operable to independently press a respective one of said separate members of said plating solution impregnated material against said porous member during a plating process.

2. A plating apparatus according to claim 1, wherein said plating solution impregnated material has joint porous members made of a soft water-retentive material and disposed in boundaries between said separate members of said plating solution impregnated material.

3. A plating apparatus according to claim 1, wherein said separate members of the plating solution impregnated material are divided by dividing planes extending perpendicularly to the surface, to be plated, of the substrate.

4. A plating apparatus according to claim 3, wherein said plating solution impregnated material has joint porous members made of a soft water-retentive material and disposed in boundaries between said separate members of said plating solution impregnated material.

5. A plating apparatus according to claim 1, wherein said separate members of the plating solution impregnated material are divided as grid-like separate members.

6. A plating apparatus according to claim 5, wherein said plating solution impregnated material has joint porous members made of a soft water-retentive material and disposed in boundaries between said separate members of said plating solution impregnated material.

7. A plating apparatus according to claim 1, wherein said separate members of the plating solution impregnated material are divided as triangular separate members.

8. A plating apparatus according to claim 7, wherein said plating solution impregnated material has joint porous members made of a soft water-retentive material and disposed in boundaries between said separate members of said plating solution impregnated material.

9. A plating apparatus according to claim 1, wherein said separate members of the plating solution impregnated material are divided as concentric separate members.

10. A plating apparatus according to claim 9, wherein said plating solution impregnated material has joint porous members made of a soft water-retentive material and disposed in boundaries between said separate members of said plating solution impregnated material.

11. A plating apparatus according to claim 1, wherein said separate members of the plating solution impregnated material are divided as sectorial separate members along radial dividing lines.

12. A plating apparatus according to claim 11, wherein said plating solution impregnated material has joint porous members made of a soft water-retentive material and disposed in boundaries between said separate members of said plating solution impregnated material.

13. A plating apparatus according to claim 1, wherein said separate members of the plating solution impregnated material are divided as separate members along concentric dividing lines and radial dividing lines.

14. A plating apparatus according to claim 13, wherein said plating solution impregnated material has joint porous members made of a soft water-retentive material and disposed in boundaries between said separate members of said plating solution impregnated material.

15. A plating apparatus according to claim 1, wherein said anode comprises a plurality of separate members which are identical in shape to said separate members of said plating solution impregnated material and superposed respectively on said separate members of said plating solution impregnated material.

16. A plating apparatus according to claim 15,
wherein each of said pressing mechanisms is operable to independently press a respective one of said separate members of said anode against said plating solution impregnated material.

17. A plating apparatus according to claim 1, wherein said plating solution impregnated material has a substantially planar shape such that said separate members of said plating solution impregnated material are simultaneously pressed against said porous member by said pressing mechanisms.

* * * * *